(12) United States Patent
Kurahashi et al.

(10) Patent No.: US 6,236,065 B1
(45) Date of Patent: *May 22, 2001

(54) LIGHT-EMITTING DIODE ARRAY AND METHOD FOR FABRICATING THE SAME

(75) Inventors: Takahisa Kurahashi, Nara; Masahiko Sakata, Soraku-gun, both of (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/948,246

(22) Filed: Oct. 9, 1997

Related U.S. Application Data

(63) Continuation of application No. 08/516,409, filed on Aug. 17, 1995, now abandoned.

(30) Foreign Application Priority Data

Aug. 25, 1994 (JP) .................................................... 6-200529

(51) Int. Cl.$^7$ .................................................... H01L 33/00

(52) U.S. Cl. ................. 257/93; 257/90; 257/88; 257/91; 372/46; 372/50

(58) Field of Search ................. 257/93, 90, 88, 257/91; 372/46, 50

(56) References Cited

U.S. PATENT DOCUMENTS

| | | | |
|---|---|---|---|
| 5,138,404 | * | 8/1992 | Ishikawa ................. 257/90 |
| 5,196,718 | * | 3/1993 | Sasagawa ................. 257/88 |
| 5,386,139 | * | 1/1995 | Idei ................. 257/93 |
| 5,406,095 | * | 4/1995 | Koyama ................. 257/88 |
| 5,408,488 | * | 4/1995 | Kurihara ................. 257/46 |

FOREIGN PATENT DOCUMENTS

| | | |
|---|---|---|
| 2-78280 | 3/1990 | (JP) . |
| 3-16278 | 1/1991 | (JP) . |
| 3-230571 | 10/1991 | (JP) . |
| 4-100278 | 4/1992 | (JP) . |
| 5-343736 | 12/1993 | (JP) . |
| 6-169104 | 6/1994 | (JP) . |
| 6-291364 | 10/1994 | (JP) . |
| 6-103759 | 12/1994 | (JP) . |

\* cited by examiner

Primary Examiner—Jerome Jackson, Jr.
(74) Attorney, Agent, or Firm—Nixon & Vanderhye P.C.

(57) ABSTRACT

The light-emitting diode array of the invention includes: a semiconductor substrate of a first conductivity type and a plurality of light-emitting elements linearly arranged on the substrate of the first conductivity type. Each of the plurality of light-emitting elements includes: a cladding layer of the first conductivity type; a cladding layer of a second conductivity type; an $(Al_xGa_{1-x})_yIn_{1-y}P$ (where $0 \leq x \leq 1$ and $0 \leq y \leq 1$) active layer interposed between the cladding layer of the first conductivity type and the cladding layer of the second conductivity type; and a current diffusion layer of the second conductivity type deposited on the cladding layer of the second conductivity type. In the light-emitting diode array, at least the current diffusion layer of the second conductivity type and the cladding layer of the second conductivity type are electrically isolated from each other in two adjacent light-emitting elements among the plurality of light-emitting elements.

23 Claims, 20 Drawing Sheets

LIGHT-EMITTING DIODE ARRAY AND METHOD FOR FABRICATING THE SAME

This is a continuation of application Ser. No. 08/516,409, filed Aug. 17, 1995, now abandoned.

BACKGROUND OF THE INVENTION

1. Field of the Invention

The present invention relates to a light-emitting diode (hereinafter, simply referred to as an "LED") array and a method for fabricating the same. More specifically, the present invention relates to an LED array usable for printing a date on a negative film in a data back unit including a date indicating system for a camera and a method for fabricating the same.

2. Description of the Related Art

Referring to FIG. 20, a conventional LED array will be described. FIG. 20 is a top plan view showing a conventional LED array usable for printing a date on a negative film in a data back unit including a data indicating system for a camera. As shown in FIG. 20, a conventional LED array includes seven light-emitting chips 100 arranged in a line. As is apparent from FIG. 20, this LED array has a simple structure easily obtained by arranging a plurality of independent light-emitting chips in a line. An electrode is denoted by the reference numeral 101. Wires connected with the electrode 101 are not shown in FIG. 20. The size of each light-emitting chip 100 is approximately 300 $\mu$m×300 $\mu$m, for example. The size of the entire LED array, including a substrate on which the LED array is mounted, is approximately 1 mm×4 mm, for example.

Each LED chip for each LED is formed on a single GaP chip, for example. Each LED chip is made of a single GaAs$_{0.15}$P$_{0.85}$. The emission spectrum of each LED chip has a peak in the vicinity of 590 nm. In practical use, this LED array for printing a date on a negative film, a driver IC and a focusing lens are mounted on a substrate.

However, since such a conventional LED array to be used for a data back unit for a camera employs a plurality of single GaAs$_{0.15}$P$_{0.85}$ LED chips of an indirect transition type formed on a single GaP chip, the luminous efficiency of these LED chips becomes disadvantageously low. This is why, in order to obtain a sufficient amount of output required for printing a date on a negative film, a current of about 20 mA is required for one LED chip. Therefore, a maximum amount of the current required for printing a date on a negative film reaches 140 mA, i.e., 20 mA×7 chips. In order to supply such an amount of current, it is indispensable to provide a driver IC for an LED array for practical use, as described above. The provision of the driver IC is an obstacle to realizing the objectives of reducing the size of the LED array, the cost necessary for fabricating the LED array and the consumption power necessary for operating the LED array.

On the other hand, FIG. 21 shows an exemplary semiconductor LED array to be used as an LED printer, as disclosed in Japanese Laid-Open Patent Publication No. 4-100278. The LED array shown in FIG. 21 uses a direct transition type (Al$_x$Ga$_{1-x}$)$_y$In$_{1-y}$P (where $0 \leq x \leq 1$ and $0 \leq y \leq 1$) layer as an active layer.

As shown in FIG. 21, the semiconductor LED array includes: an n-type InGaAlP cladding layer 202; an InGaAlP active layer 203; a p-type InGaAlP cladding layer 204; and a p-type GaAlAs layer 205. These layers are deposited in this order on a GaAs substrate 201. In FIG. 21, an n-type electrode is denoted by 206; a GaAs contact layer for forming an electrode is denoted by 207; a p-type electrode is denoted by 208; an n-type InGaAlP insulating layer is denoted by 209; and a bonding pad is denoted by 210.

Since this structure uses a direct transition type (Al$_x$Ga$_{1-x}$)$_y$In$_{1-y}$P (where $0 \leq x \leq 1$ and $0 \leq y \leq 1$) as the active layer 203, a relatively high output can be advantageously obtained at a low current value. Therefore, by employing this structure, the reduction in the amount of the current required for printing a date on a negative film in a data back unit for a camera can be expected.

In addition, since this structure applicable to a data back unit for a camera is a monolithic LED array as shown in FIG. 21, it is possible to reduce the size of the LED array as compared with the LED array obtained by independently arranging a plurality of light-emitting chips (or elements) in a line as shown in FIG. 20. Moreover, this structure also makes it possible to reduce the spot diameter of the light emitted from the LED, so that an optical system such as a lens, which has conventionally been required for focusing a spot, is no longer necessary. As a result, the size of the entire system using a data back unit for a camera can be reduced. As compared with a conventional LED array using indirect transition type LED chips shown in FIG. 20, the LED array shown in FIG. 21 surely enables the reduction in the amount of the current required for printing a date on a negative film. However, in order to practically use this LED array for a camera, the maximum amount of the light which can be emitted from this LED array is not sufficiently large for the value of the current required for the emission. Therefore, an LED array allowing for emitting a sufficient amount of light at a lower current value is expected to be developed.

SUMMARY OF THE INVENTION

The light-emitting diode array of the invention including: a semiconductor substrate of a first conductivity type, and a plurality of light-emitting elements linearly arranged on the substrate of the first conductivity type. Each of the plurality of light-emitting elements includes: a cladding layer of the first conductivity type; a cladding layer of a second conductivity type; an (Al$_x$Ga$_{1-x}$)$_y$In$_{1-y}$P (where $0 \leq x \leq 1$ and $0 \leq y \leq 1$) active layer interposed between the cladding layer of the first conductivity type and the cladding layer of the second conductivity type; and a current diffusion layer of the second conductivity type deposited on the cladding layer of the second conductivity type. In the light-emitting diode array, at least the current diffusion layer of the second conductivity type and the cladding layer of the second conductivity type are electrically isolated from each other in two adjacent light-emitting elements among the plurality of light-emitting elements.

In one embodiment, at least the current diffusion layer of the second conductivity type and the cladding layer of the second conductivity type are electrically isolated from each other by performing an etching between the two adjacent light-emitting elements among the plurality of light-emitting elements.

In another embodiment, the light-emitting diode array further includes an insulating layer formed on the current diffusion layer of the second conductivity type.

In still another embodiment, the insulating layer is a SiN$_x$ layer.

In still another embodiment, the light-emitting diode array further includes: a current blocking layer of the first conductivity type disposed on a side of the current diffusion layer with respect to the active layer; and a window for outputting emitted light formed by partially etching the current blocking layer of the first conductivity type.

In still another embodiment, a band gap of the current blocking layer of the first conductivity type is smaller than a band gap of the active layer.

In still another embodiment, the current blocking layer of the first conductivity type is an $(Al_xGa_{1-x})_yIn_{1-y}P$ (where $0 \leq x \leq 1$ and $0 \leq y \leq 1$) layer.

In still another embodiment, the current blocking layer of the first conductivity type is formed as an uppermost layer of the light-emitting diode array except for electrode portions.

In still another embodiment, the current blocking layer of the first conductivity type is a GaAs layer.

In still another embodiment, a multi-layered reflection film of the first conductivity type is formed between the substrate and the active layer.

In still another embodiment, the multi-layered reflection film of the first conductivity type is a reflection film obtained by alternately depositing 20 pairs each of $Al_{0.5}In_{0.5}P$ layers and $(Al_{x1}Ga_{1-x1})_{0.5}In_{0.5}P$ layers, where x is a mixed crystal ratio of Al in the active layer and $x_1 > x$.

According to another aspect of the invention, a method for fabricating a light-emitting diode array is provided. The method includes the steps of: forming a cladding layer of a first conductivity type on a substrate of the first conductivity type; forming a cladding layer of a second conductivity type and an $(Al_xGa_{1-x})_yIn_{1-y}P$ (where $0 \leq x \leq 1$ and $0 \leq y \leq 1$) active layer on the cladding layer of the first conductivity type so that the active layer is interposed between the cladding layer of the first conductivity type and the cladding layer of the second conductivity type; forming an $Al_zGa_{1-z}As$ (where $0 \leq z \leq 1$) current diffusion layer on the cladding layer of the second conductivity type; etching the $Al_zGa_{1-z}As$ (where $0 \leq z \leq 1$) current diffusion layer as a first etching process step by using a first etchant allowing for selectively etching the current diffusion layer without etching the cladding layer of the second conductivity type; etching the cladding layer of the second conductivity type as a second etching process step by using a second etchant allowing for selectively etching the cladding layer; and etching the $Al_zGa_{1-z}As$ (where $0 \leq z \leq 1$) current diffusion layer again as a third etching process step by using a third etchant allowing for selectively etching the current diffusion layer without etching the cladding layer of the second conductivity type.

In one embodiment, the first etchant is a sulfuric acid and hydrogen peroxide based etchant, the second etchant is a heated sulfuric acid etchant, and the third etchant is a sulfuric acid and hydrogen peroxide based etchant.

As shown in FIG. 20, since a conventional LED array to be used as a data back unit for a camera employs a plurality of single $GaAs_{0.15}P_{0.85}$ LED chips of an indirect transition type formed on a GaP chip, the luminous efficiency of these LED chips is disadvantageously low. On the other hand, in an LED array of the invention, since a direct transition type $(Al_xGa_{1-x})_yIn_{1-y}P$ (where $0 \leq x \leq 1$ and $0 \leq y \leq 1$) is used as an active layer, it is possible to reduce an amount of the consumed current. In addition, the LED array of the invention has a monolithic structure unlike the structure including a plurality of single LED chips arranged in a line as shown in FIG. 20, so that it is possible to considerably reduce the size of the light-emitting portion for printing a date. Moreover, the emission spot diameter can also be reduced, so that it is no longer necessary to use an optical system such as a lens which has conventionally been required for focusing a spot. As a result, the size of the entire system using a data back unit for a camera can also be reduced.

Furthermore, since the portions of two adjacent light-emitting elements covering at least from a current diffusion layer to a cladding layer of a second conductivity type are removed by etching, it is possible to electrically separate the respective light-emitting elements.

Moreover, by providing a current blocking layer in the portion other than the emission portion, it is possible to suppress an inefficient emission under the electrode and prevent waste of the consumed power. In addition, in the case where a current diffusion layer is provided on a current blocking layer (see Examples 1 to 3), it is no longer necessary to provide an electrode for injecting a current on a plane used for emitting the light. As a result, the light can be output more effectively.

Also, by setting the band gap of the current blocking layer to be smaller than the band gap of the active layer, it is possible to absorb the light obliquely emitted from the emission portion into the current blocking layer, thereby separating the light beams emitted from adjacent light-emitting elements more precisely.

In addition, by providing a multi-layered reflection film, it is possible to reflect the light proceeding downwards to an upward direction, thereby outputting the emitted light more effectively.

Furthermore, by performing the above-described three etching process steps, it is possible to form a mesa in a uniform shape without any convex portion in each light-emitting element. Such a shape can be obtained in the following manner. A current diffusion layer is etched in a trapezoidal shape during the first etching process step, and a cladding layer and an active layer are etched in a similar trapezoidal shape during the second etching process step. However, the cladding layer and the active layer are over-etched to a certain degree in the upper portion of the trapezoid or the lower portion of the current diffusion layer, so that the lower end portion of the current diffusion layer comes to project. By performing the third etching process step in order to etch the current diffusion layer again by using a sulfuric acid and hydrogen peroxide, and eliminating the convex portion in a projective shape, a mesa in a uniform shape can be obtained. Therefore, since a mesa in a uniform shape can be obtained by performing the three etching process steps, it is possible to realize a highly reliable LED array which is not likely to be deformed or broken even at a low temperature owing to the stress to be applied.

Consequently, according to the present invention, it is possible to realize a monolithic structure unlike the conventional LED array obtained by arranging a plurality of independent LED chips in parallel on a substrate or the like as shown in FIG. 20, thereby remarkably reducing the size of an LED array.

In addition, since the spot diameter of the light emitted from the emission portion can be reduced, it is no longer necessary to use an optical system such as a lens which has conventionally been required for focusing a spot. As a result, the size of the entire system using a data back unit for a camera can also be reduced.

Furthermore, by performing the etching process between adjacent light-emitting elements, the respective light-emitting elements can surely emit light independently, and the light beams emitted from the respective elements can be separated with high precision.

In addition, by performing a mesa etching for each element at three stages, it is possible to uniformly shape the mesa without any convex portion on the side thereof. As a result, the LED is unlikely to be deformed owing to the distortion caused by stress even at a low temperature, and it is possible to realize a highly reliable LED which is not likely to be deformed or broken owing to the distortion caused by the stress.

Thus, the invention described herein makes possible the advantage of providing a light-emitting diode array allowing for reducing the amount of the operational current while maintaining an output required for operating the light-emitting diode array as a data back unit for a camera; and remarkably improving the luminous efficiency thereof, and a method for fabricating the same.

This and other advantages of the present invention will become apparent to those skilled in the art upon reading and understanding the following detailed description with reference to the accompanying figures.

BRIEF DESCRIPTION OF THE DRAWINGS

FIG. 2A is a top plan view of a single LED used for the LED array shown in FIG. 1, while

FIG. 4A is a top plan view of a single LED shown in FIGS. 2A and 2B at a fabrication process step, while

FIG. 5A is a top plan view of the single LED shown in FIGS. 2A and 2B at another fabrication process step, while

FIG. 6A is a top plan view of the single LED shown in FIGS. 2A and 2B at still another fabrication process step, while

FIG. 9A is a top plan view of a single LED used for the LED array shown in FIG. 8, while

FIG. 10A is a top plan view of the single LED shown in FIGS. 9A and 9B at a fabrication process step, while

FIG. 11A is a top plan view of the single LED shown in FIGS. 9A and 9B at another fabrication process step, while

FIG. 12A is a top plan view of the single LED shown in FIGS. 9A and 9B at still another fabrication process step, while

FIG. 14A is a top plan view of a single LED used for the LED array shown in FIG. 13, while

FIG. 15A is a top plan view of the single LED shown in FIGS. 14A and 14B at a fabrication process step, while

FIG. 16A is a top plan view of the single LED shown in FIGS. 14A and 14B at another fabrication process step, while

FIG. 17A is a top plan view of the single LED shown in FIGS. 14A and 14B at still another fabrication process step, while

DESCRIPTION OF THE PREFERRED EMBODIMENTS

Figure 21:
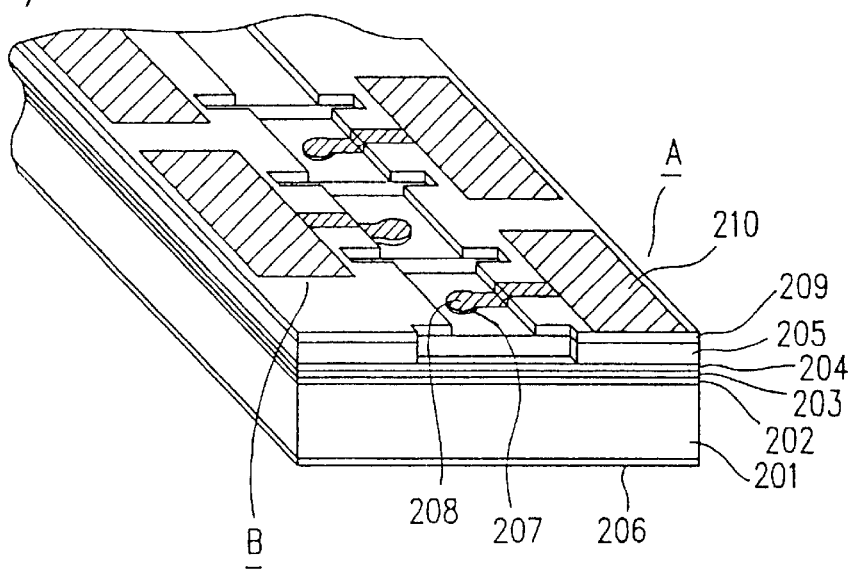
FIG. 21 is a perspective view of a conventional semiconductor LED apparatus to be used for an LED printer.

The present inventors have found when the LED array shown in FIG. 21 is used practically, a current undesirably flows between the adjacent light-emitting elements and it is impossible to independently emit the light from each light-emitting element, because the p-type GaAlAs layers 205 functioning as current diffusion layers are not isolated between the adjacent light-emitting elements, e.g., elements A and B shown in FIG. 21.

In order to solve such a conventional problem, the present invention has been developed. The effects attained by the present invention are as follows: 1) By using a direct transition type $(Al_xGa_{1-x})_yIn_{1-y}P$ (where $0 \leq x \leq 1$ and $0 \leq y \leq 1$) as an active layer, it is possible to reduce an amount of the consumed current. In addition, by providing a current blocking layer and a multi-layered reflection film, an extremely high luminous efficiency is realized. 2) By providing the current blocking layer, it is not necessary to provide an electrode on an emission plane and the light can be output more effectively. 3) A monolithic structure unlike a conventional one is realized for a data back unit for a camera, and the size of the system for mounting a camera can be reduced. 4) In order to realize such a monolithic structure, a fabrication method in which the respective light-emitting elements (hereinafter, simply referred to as "elements") can be surely isolated and a highly uniform mesa can be formed is provided.

Hereinafter, the present invention will be described by way of illustrative examples with reference to accompanying drawings.

EXAMPLE 1

Figure 1:
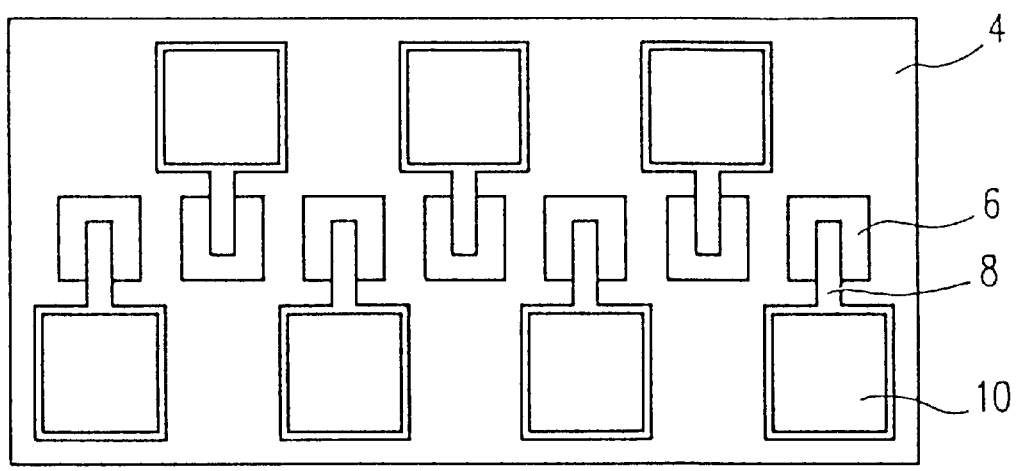
FIG. 1 is a top plan view of an LED array according to an example of the present invention.
Figure 2A:
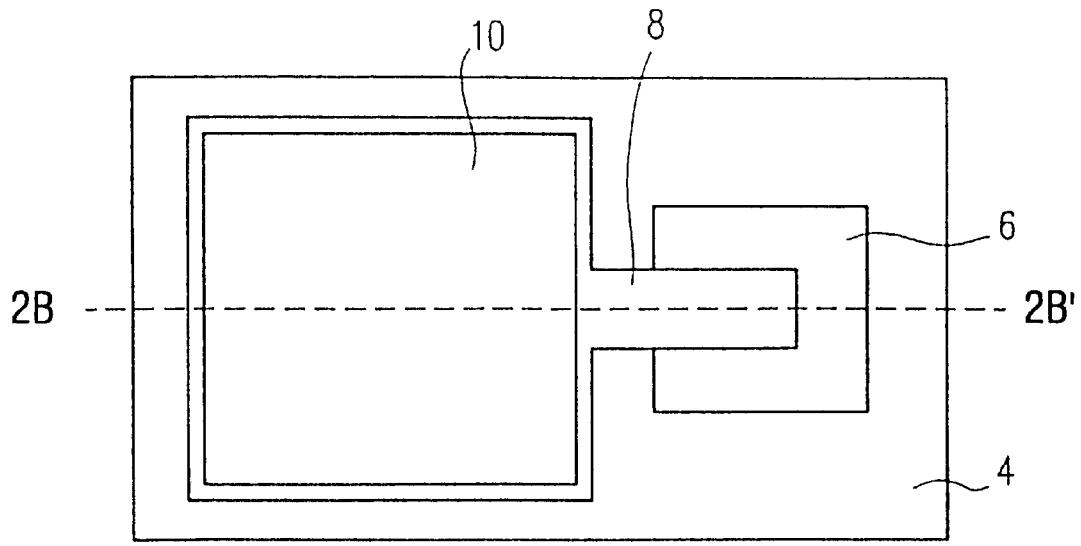
Figure 2B:
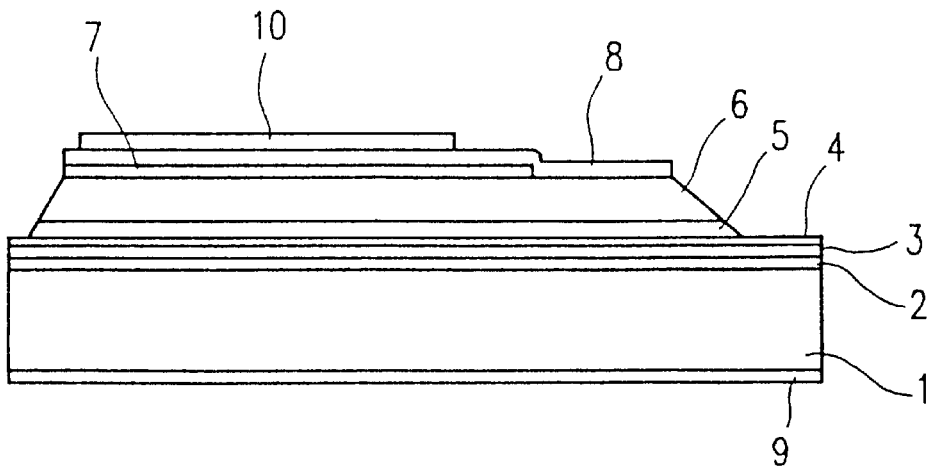
FIG. 2B is a cross-sectional view taken along the line 2B–2B' of the single LED shown in FIG. 2A.
Figure 3:
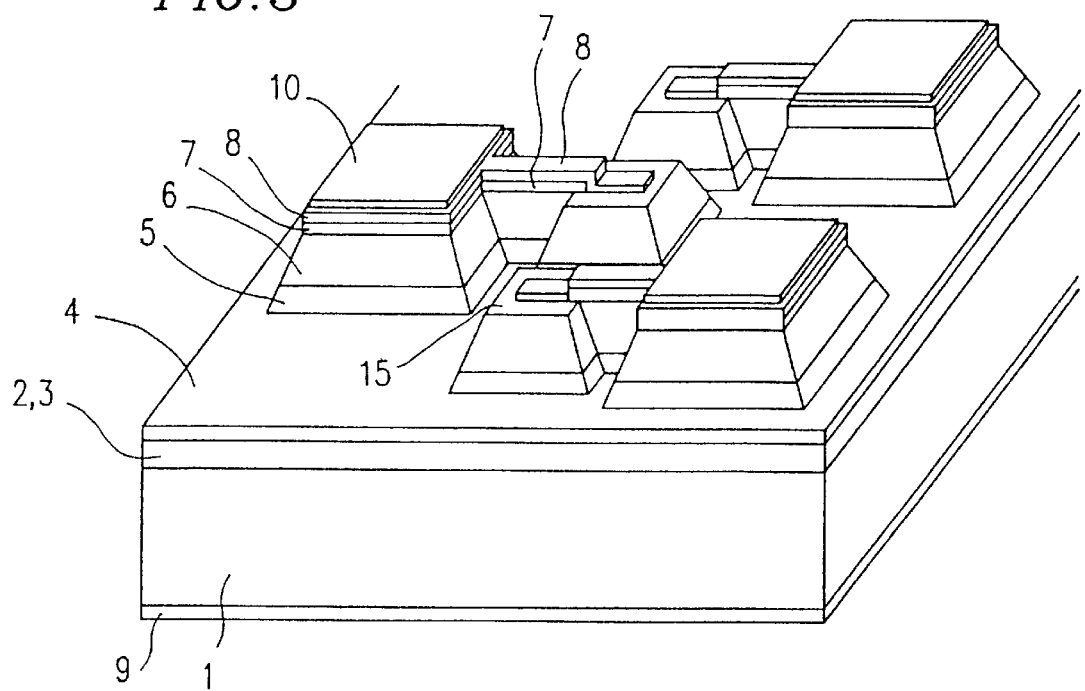
FIG. 3 is a perspective view of the LED array shown in FIG. 1.
Figure 4A:
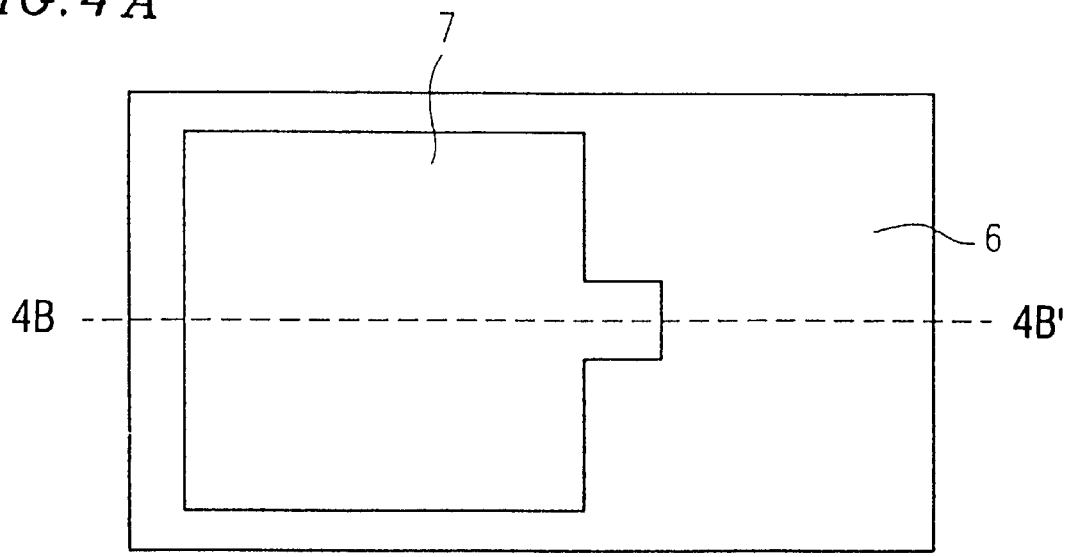
Figure 5A:
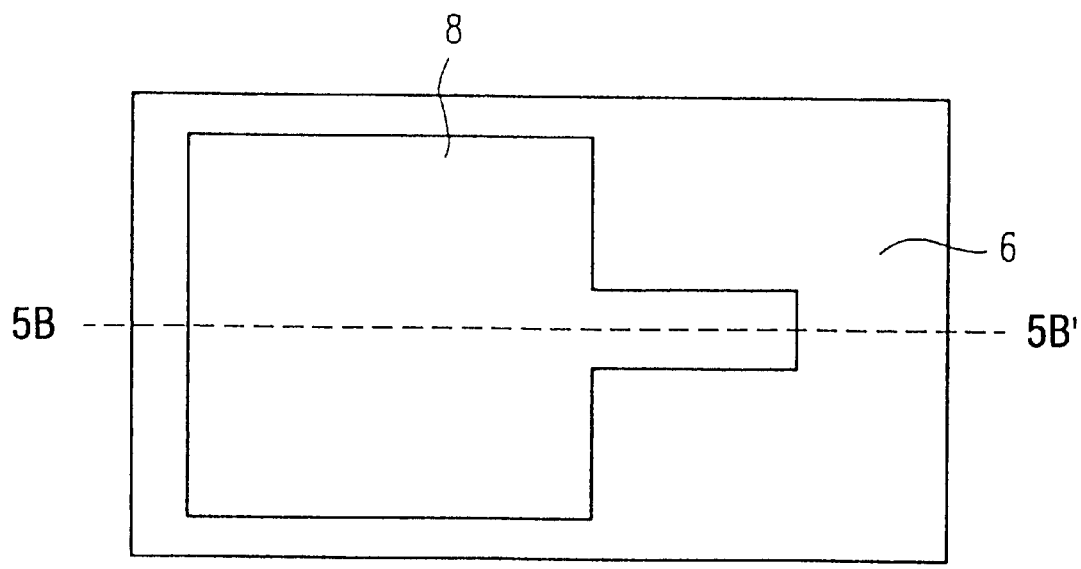
Figure 5B:
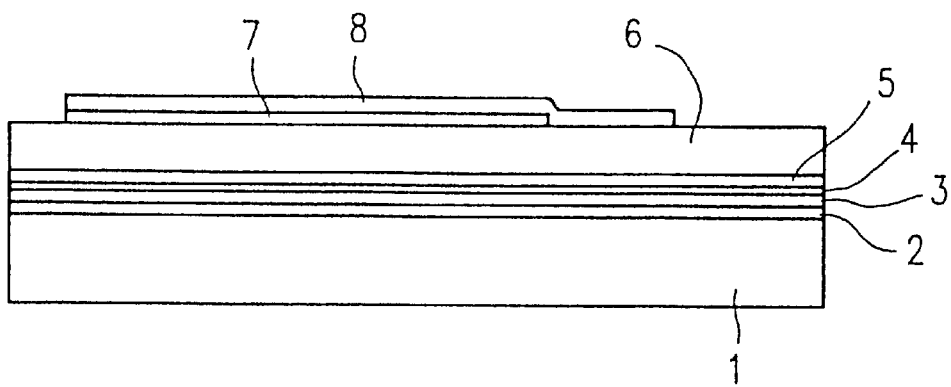
FIG. 5B is a cross-sectional view taken along the line 5B–5B' of the single LED shown in FIG. 5A.
Figure 6A:
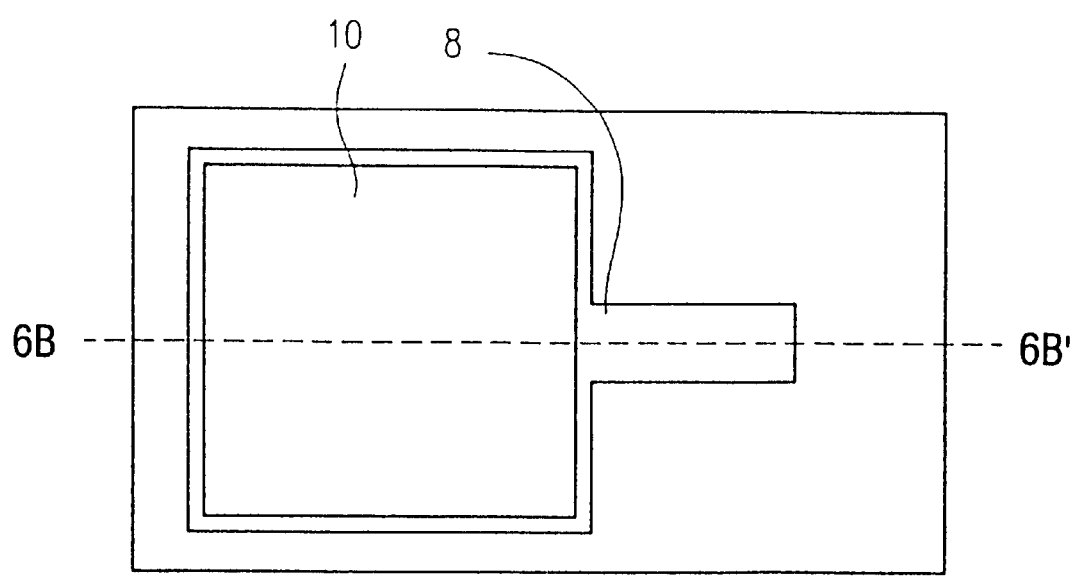
Figure 6B:
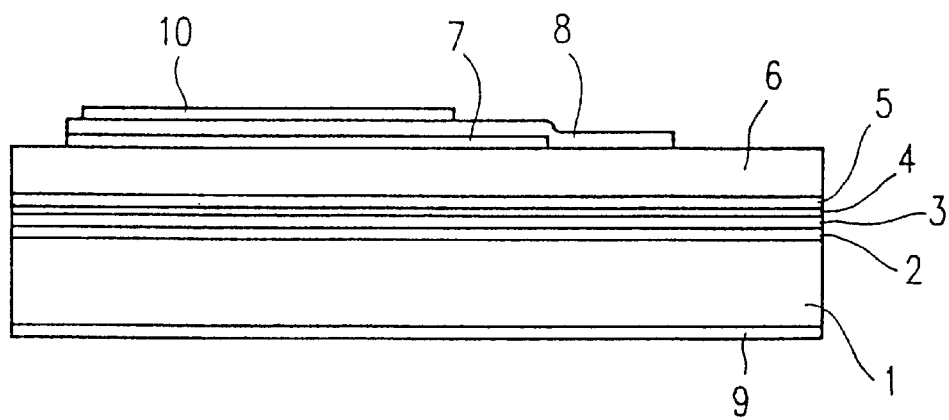
FIG. 6B is a cross-sectional view taken along the line 6B–6B' of the single LED shown in FIG. 6A.

FIG. 1 is a top plan view of an LED array according to an example of the present invention. FIG. 2A is a top plan view of a single LED used for the LED array shown in FIG. 1, while FIG. 2B is a cross-sectional view taken along the line 2B–2B' of the single LED shown in FIG. 2A. FIG. 3 is a partial perspective view of the LED array shown in FIG. 1. FIGS. 4A, 5A and 6A are top plan views of the single LED shown in FIGS. 2A and 2B at respective fabrication process steps, while FIGS. 4B, 5B and 6B are cross-sectional views taken along the line lines 4B–4B', 5B–5B' and 6B–6B' of the single LED shown in FIGS. 4A, 5A and 6A, respectively.

As shown in FIGS. 2A, 2B and 3, the LED array of the invention includes: an n-type GaAs substrate 1; an n-type (n=5×10$^{17}$ cm$^{-3}$) GaAs buffer layer 2 formed on the n-type GaAs substrate 1; an n-type (n=5×10$^{17}$ cm$^{-3}$) Al$_{0.5}$In$_{0.5}$P cladding layer 3; a p-type (p=3×10$^{17}$ cm$^{-3}$) Al$_{0.5}$In$_{0.5}$P cladding layer 5; an undoped (Al$_{0.3}$Ga$_{0.7}$)$_{0.5}$In$_{0.5}$P active layer 4 interposed between the n-type (n=5×10$^{17}$ cm$^{-3}$) Al$_{0.5}$In$_{0.5}$P cladding layer 3 and the p-type (p=3×10$^{17}$ cm$^{-3}$) Al$_{0.5}$In$_{0.5}$P cladding layer 5; an Al$_{0.7}$Ga$_{0.3}$As current diffusion layer 6 formed on the p-type (p=3×10$^{17}$ cm$^{-3}$) Al$_{0.5}$In$_{0.5}$P cladding layer 5; an SiN$_x$ film 7; a p-type electrode 8; an n-type electrode 9; and a bonding pad 10.

In the LED array shown in FIG. 3, a plurality of portions 15 for outputting the light emitted from the respective elements are linearly arranged on the GaAs substrate 1, and the bonding pads 10 are disposed symmetrically with respect to the portions 15 linearly arranged. The portions 15 are connected with the bonding pads 10 via the p-type electrode 8. By using such a configuration, the size of the LED array can be reduced.

Figure 4B:
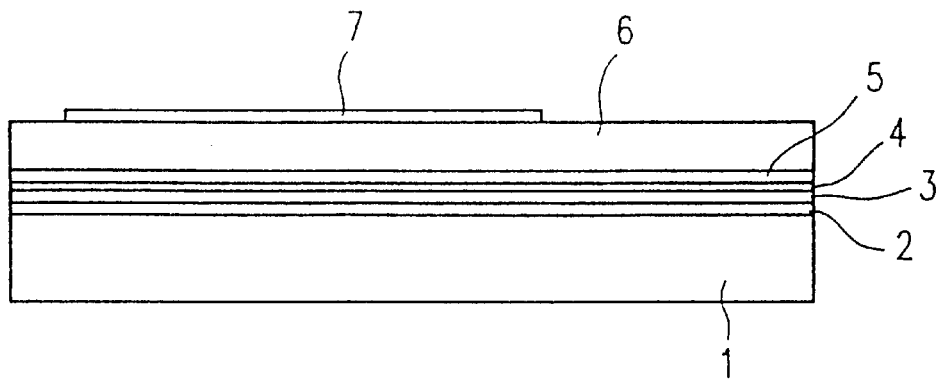
FIG. 4B is a cross-sectional view taken along the line 4B–4B' of the single LED shown in FIG. 4A.

First, as shown in FIGS. 4A and 4B, the n-type (n=5×10$^{17}$ cm$^{-3}$) GaAs buffer layer 2, the n-type (n=5×10$^{17}$ cm$^{-3}$) Al$_{0.5}$In$_{0.5}$P cladding layer 3, the undoped (Al$_{0.3}$Ga$_{0.7}$)$_{0.5}$In$_{0.5}$P active layer 4, the p-type (p=3×10$^{17}$ cm$^{-3}$) Al$_{0.5}$In$_{0.5}$P cladding layer 5 and the Al$_{0.7}$Ga$_{0.3}$As current diffusion layer 6 are deposited in this order on the n-type GaAs substrate 1, thereby forming the LED array shown in FIGS. 1 to 3. All these layers are formed by a metalorganic chemical vapor deposition (MOCVD) method. The thicknesses of the buffer layer 2, the cladding layer 3, the active layer 4, the cladding layer 5 and the current diffusion layer 6 respectively are 0.5 μm, 1 μm, 0.6 μm, 1 μm and 3 μm.

Next, the SiN$_x$ film 7 is formed on the Al$_{0.7}$Ga$_{0.3}$As current diffusion layer 6 by a plasma CVD method, and an insulating layer for preventing the injection of the current under the bonding pad 10 is formed by performing a photolithography process and an etching process using a buffered hydrofluoric acid. An SiN$_x$ film, an SiO$_2$ film, an SiO film or an Si—O—N film is used as the insulating layer.

Then, as shown in FIGS. 5A and 5B, Ti/AuZn is sputtered from the surface of the SiN$_x$ film 7. Thereafter, by performing a photolithographic process, an etching process using an iodine based etchant and dilute hydro-fluoric acid, and a heat treatment, the p-type electrode 8 is formed.

Subsequently, as shown in FIGS. 6A and 6B, AuGe/Ni is deposited on the reverse surface of the n-type GaAs substrate 1 and subjected to a heat treatment, thereby forming the n-type electrode 9. Then, Ti/Au is sputtered from the side of the p-type electrode 8. Thereafter, by performing a photolithography process and a chemical etching process using an iodine based etchant and dilute hydrofluoric acid, the bonding pad 10 is formed.

Next, by performing a photolithographic process for electrically isolating the respective elements and a mesa etching using a sulfuric acid and hydrogen peroxide based etchant and heated phosphoric acid before the (Al$_{0.3}$Ga$_{0.7}$)$_{0.5}$In$_{0.5}$P active layer 4 is etched, the LED shown in FIGS. 2A and 2B can be obtained.

The monolithic LED array thus formed according to the method of this example uses an (Al$_{0.3}$Ga$_{0.7}$)$_{0.5}$In$_{0.5}$P active layer of a direct transition type as a light-emitting layer, so that it is possible to obtain a sufficient amount of output for printing a date on a negative film by using a current about one tenth of the current required for a conventional LED array using an indirect transition type GaAs$_{0.15}$P$_{0.85}$ layer to print the date on the film for a data back unit for a camera.

Figure 20:
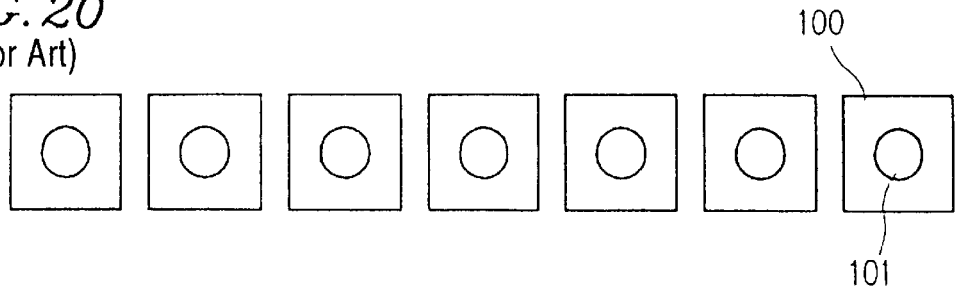
FIG. 20 is a top plan view of a conventional LED array.

In addition, the size of the entire LED array shown in FIG. 20 obtained by arranging in a line seven light-emitting chips with a size of approximately 300 μm×300 μm becomes approximately 1 mm×4 mm. On the other hand, since the LED array of this example has a monolithic structure, it is possible to considerably reduce the size of the entire LED array to about 500 μm×700 μm in the case of employing the structure shown in FIG. 1.

Figure 7:
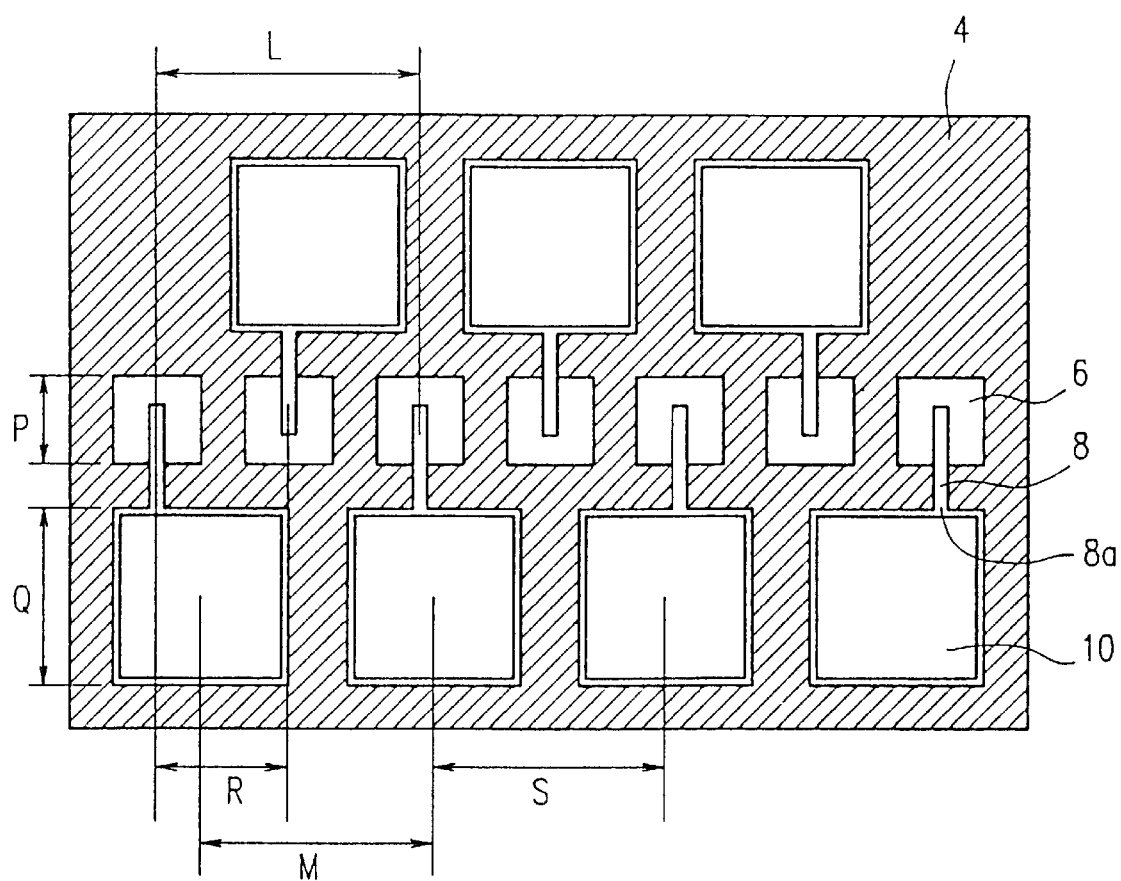
FIG. 7 is a top plan view showing an embodiment of the LED array shown in FIG. 1.

The size of the LED array can be further reduced by closely arranging the respective elements as shown in FIG. 7. In FIG. 7, adjacent elements can be disposed more closely by disposing the connection portion 8a between each p-type electrode 8 and each bonding pad 10 at a position deviating from the center of the upper side of the bonding pad 10. More specifically, a distance M between the centers of the linearly adjacent bonding pads 10 which are alternately disposed on the upper and the lower portions in FIG. 7 is set to be smaller than the distance L between the centers of the adjacent emission portions. By using such a disposition, the size of the LED array can be further reduced. In other words, by disposing the respective elements more closely so that the convex portions and the concave portions of the adjacent elements engage each other, the size of the LED array can be further reduced. In such a case, the size of the entire LED array can be reduced to about 450 μm×650 μm. In FIG. 7, a side P of each element is about 60 μm, a side Q of each pad is about 120 μm, a pitch R between adjacent elements is about 90 μm, and a pitch S between adjacent pads is about 160 μm.

In addition, the spot diameter of the emission portion can also be reduced, so that it is no longer necessary to provide an optical system such as a lens which has conventionally been required for focusing a spot. As a result, the size of the entire system using a data back unit for a camera can be reduced.

Furthermore, since the etching process is performed between the adjacent elements before the active layer 4 is etched, the current injected into one element does not unintentionally flow into another element, so that it is surely possible to independently emit the light beams from the respective elements.

EXAMPLE 2

Figure 8:
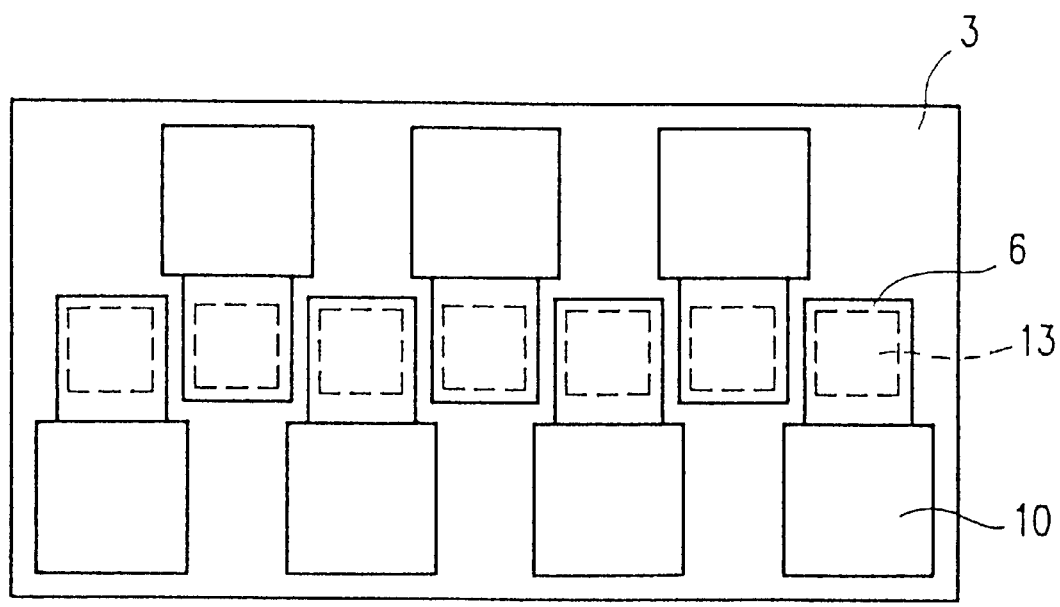
FIG. 8 is a top plan view of an LED array according to a second example of the present invention.
Figure 9A:
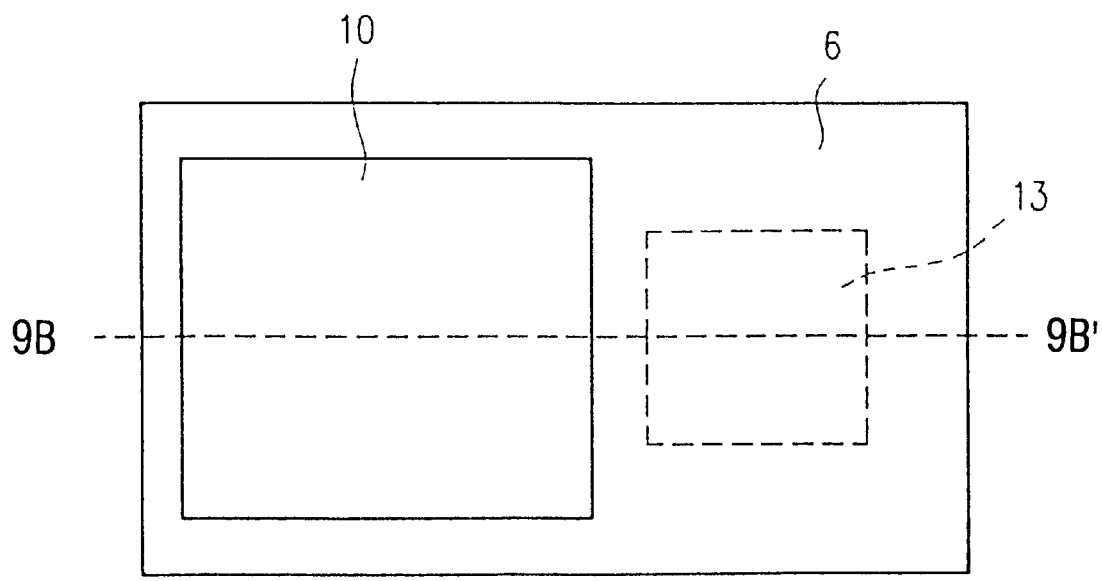
Figure 9B:
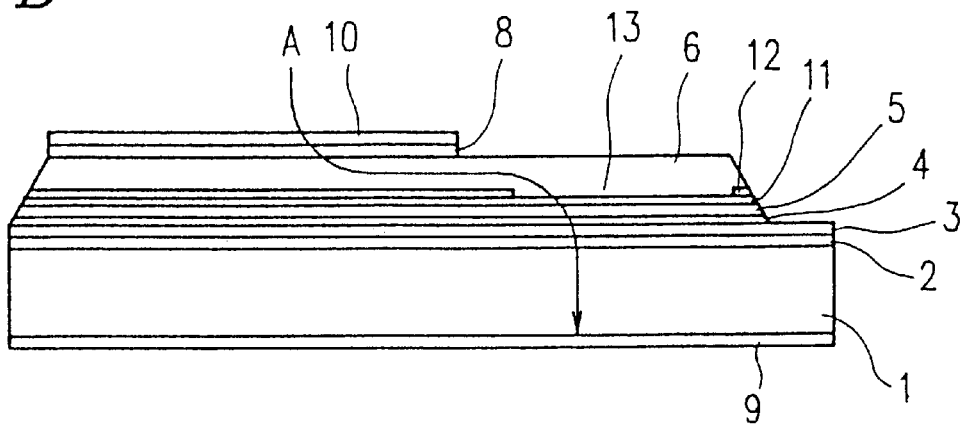
FIG. 9B is a cross-sectional view taken along the line 9B–9B' of the single LED shown in FIG. 9A.
Figure 10A:
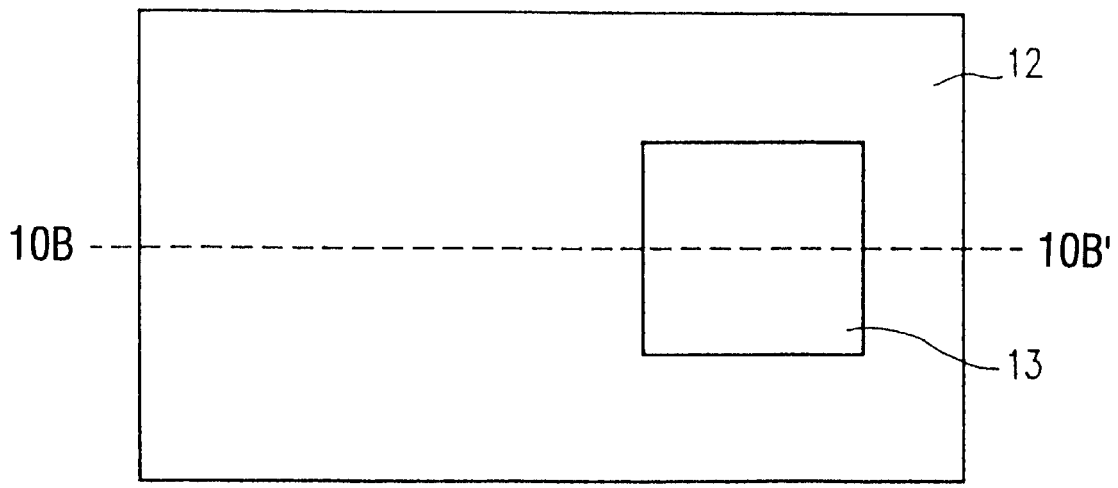
Figure 11A:
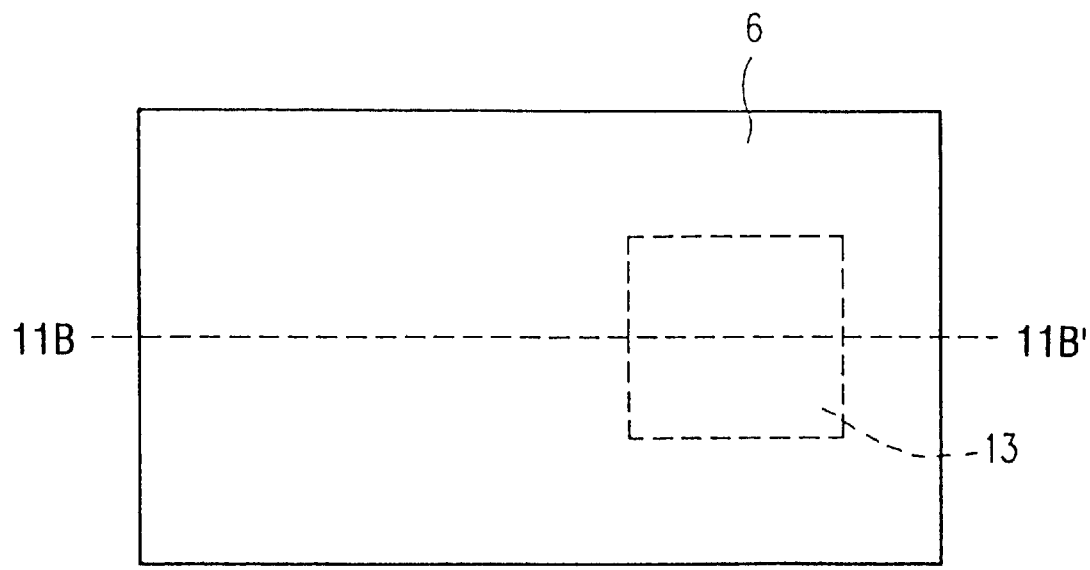
Figure 11B:
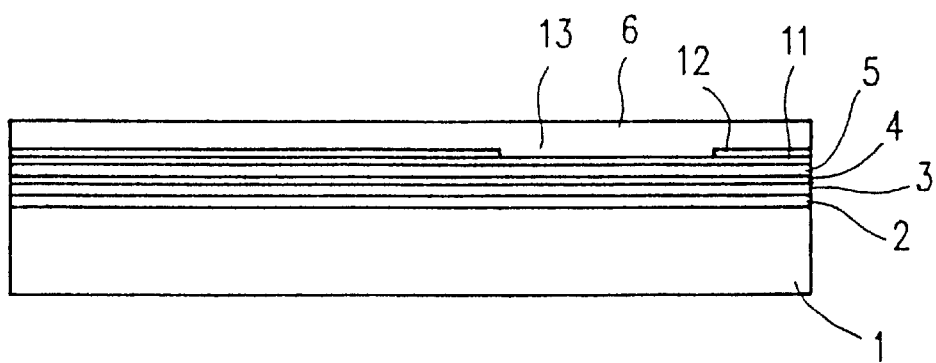
FIG. 11B is a cross-sectional view taken along the line 11B–11B' of the single LED shown in FIG. 11A.
Figure 12A:
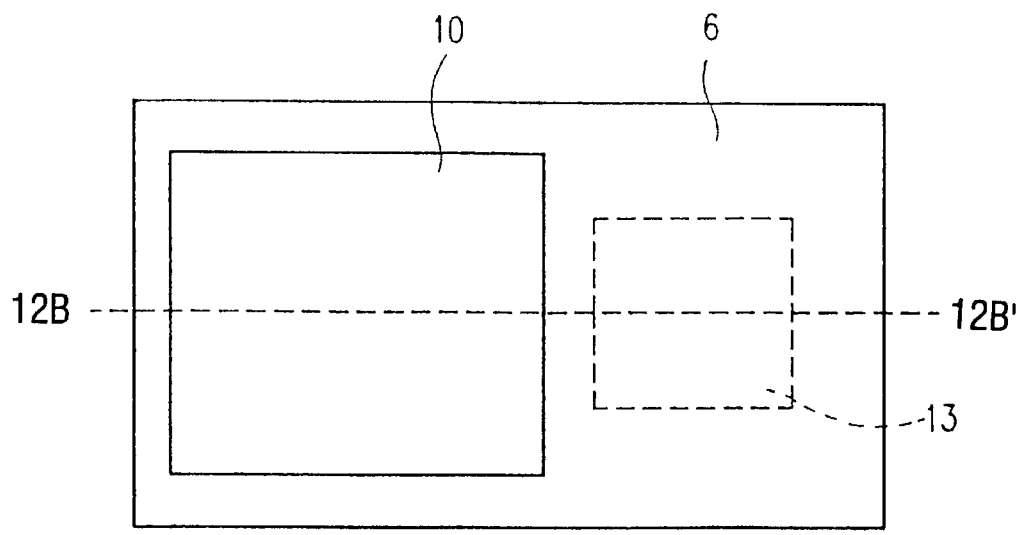
Figure 12B:
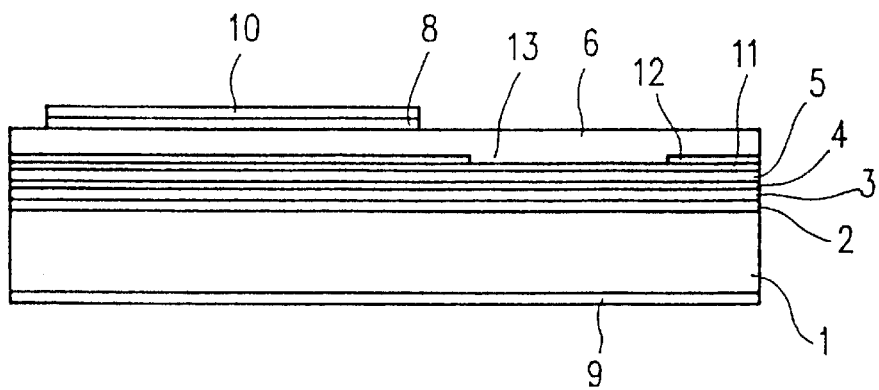
FIG. 12B is a cross-sectional view taken along the line 12B–12B' of the single LED shown in FIG. 12A.

FIG. 8 is a top plan view of an LED array according to a second example of the present invention. FIG. 9A is a top plan view of a single LED used for the LED array shown in FIG. 8, while FIG. 9B is a cross-sectional view taken along the line 9B–9B' of the single LED shown in FIG. 9A. FIGS. 10A, 11A and 12A are top plan views of the single LED shown in FIGS. 9A and 9B at respective fabrication process steps, while FIGS. 10B, 11B and 12B are cross-sectional views taken along the lines 10B–10B', 11B–11B' and 12B–12B' of the single LED shown in FIGS. 10A, 11A and 12A.

As shown in FIGS. 9A and 9B, the LED according to the second example of the invention includes: an n-type GaAs substrate 1; an n-type (n=5×10$^{17}$ cm$^{-3}$) GaAs buffer layer 2 formed on the n-type GaAs substrate 1; an n-type (n=5×10$^{17}$ cm$^{-3}$) Al$_{0.5}$In$_{0.5}$P cladding layer 3; a p-type (p=3×10$^{17}$ cm$^{-3}$) Al$_{0.5}$In$_{0.5}$P cladding layer 5; an undoped (Al$_{0.3}$Ga$_{0.7}$)$_{0.5}$In$_{0.5}$P active layer 4 interposed between the n-type (n=5×10$^{17}$ cm$^{-3}$) Al$_{0.5}$In$_{0.5}$P cladding layer 3 and the p-type (p=3×10$^{17}$ cm$^{-3}$) Al$_{0.5}$In$_{0.5}$P cladding layer 5; a p-type (p=3×10$^{17}$ cm$^{-3}$) Ga$_{0.5}$In$_{0.5}$P cap layer 11; an n-type (n=2×10$^{18}$ cm$^{-3}$) (Al$_{0.2}$Ga$_{0.8}$)$_{0.5}$In$_{0.5}$P current blocking layer 12; a window 13 for outputting the light; an Al$_{0.7}$Ga$_{0.3}$As current diffusion layer 6; a p-type electrode 8; an n-type electrode 9; and a bonding pad 10. In this example, the current blocking layer 12 is formed in the portion excluding the window 13 for outputting the light between the cap layer 11 and the p-type electrode 8. As a result, it is possible to suppress the inefficient emission under the p-type electrode 8.

Figure 10B:
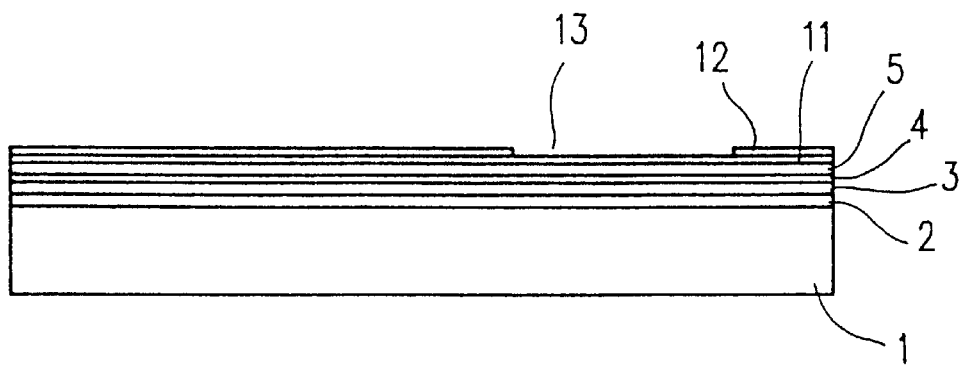
FIG. 10B is a cross-sectional view taken along the line 10B–10B' of the single LED shown in FIG. 10A.

First, as shown in FIGS. 10A and 10B, the n-type (n=5×10$^{17}$ cm$^{-3}$) GaAs buffer layer 2, the n-type (n=5×10$^{17}$ cm$^{-3}$) Al$_{0.5}$In$_{0.5}$P cladding layer 3, the undoped (Al$_{0.3}$Ga$_{0.7}$)$_{0.5}$In$_{0.5}$P active layer 4, the p-type (p=3×10$^{17}$ cm$^{-3}$) Al$_{0.5}$In$_{0.5}$P cladding layer 5, the p-type (p=3×10$^{17}$ cm$^{-3}$) Ga$_{0.5}$In$_{0.5}$P cap layer 11 and the n-type (n=2×10$^{18}$ cm$^{-3}$) (Al$_{0.2}$Ga$_{0.8}$)$_{0.5}$In$_{0.5}$P current blocking layer 12 are deposited in this order on the n-type GaAs substrate 1, thereby forming the LED array shown in FIGS. 8, 9A and 9B. The current blocking layer 12 is made of a light absorptive material. All these layers are formed by a metalorganic chemical vapor deposition (MOCVD) method. The thicknesses of the buffer layer 2, the cladding layer 3, the active layer 4, the cladding layer 5, the cap layer 11 and the current blocking layer 12 respectively are 0.5 μm, 1 μm, 0.6 μm, 1 μm, 50 Å and 0.2 μm.

Next, the n-type (Al$_{0.2}$Ga$_{0.8}$)$_{0.5}$In$_{0.5}$P current blocking layer 12 is etched by using heated phosphoric acid, thereby forming the window 13 for outputting the light. Then, as shown in FIGS. 11A and 11B, an Al$_{0.7}$Ga$_{0.3}$As current diffusion layer 6 is deposited by an MOCVD method on the n-type (n=2×10$^{18}$ cm$^{-3}$) (Al$_{0.2}$Ga$_{0.8}$)$_{0.5}$In$_{0.5}$P current blocking layer 12 and the window 13 for outputting the light so as to be 3 μm thick.

Then, as shown in FIGS. 12A and 12B, Ti/AuZn/Ti/Au is formed on the Al$_{0.7}$Ga$_{0.3}$As current diffusion layer 6 by performing a sputtering process. Thereafter, by performing a photolithographic process, a chemical etching process using iodine based etchant and dilute hydrofluoric acid and a heat treatment, the p-type electrode 8 is formed. Subsequently, AuGe/Ni is deposited on the reverse surface of the n-type GaAs substrate 1 and subjected to a heat treatment, thereby forming the n-type electrode 9. The bonding pad is denoted by 10. Thereafter, by performing a photolithographic process for electrically isolating the respective elements and a chemical etching process using a sulfuric acid and hydrogen peroxide based etchant and a bromine based etchant, and a mesa etching using heated phosphoric acid before the n-type Al$_{0.5}$In$_{0.5}$P cladding layer 3 is etched, the LED shown in FIGS. 9A and 9B can be obtained.

The method of this second example is different from the method of the first example in the mesa etching. More specifically, in the first example described referring to FIGS. 1 to 6, the mesa etching is performed before the active layer 4 is etched. On the other hand, in this second example, the mesa etching is performed before the n-type Al$_{0.5}$In$_{0.5}$P cladding layer 3 underlying the active layer 4 is etched. According to the method of the second example, the respective elements can be completely isolated. However, it is difficult to stop the etching process at the upper surface of the cladding layer 3, so that it becomes difficult to control the etching when the cladding layer 3 is required to be partially etched. Based on the experimental results, it is known that it is sufficient to perform the mesa etching process before the active layer 4 is etched as described in the first example, in order to prevent the leakage of the light.

The LED array thus formed according to the method of the second example of the invention makes possible the same advantages as those attained by the method of the first example: 1) By using a direct transition type (Al$_{0.3}$Ga$_{0.7}$)$_{0.5}$In$_{0.5}$P layer as a light-emitting layer, it is possible to obtain a sufficient amount of output for printing a date on a negative film at a low current value. 2) A monolithic structure unlike a conventional one obtained by arranging seven light-emitting chips in a line is realized for the LED array of this example, so that the size of the entire LED array can be considerably reduced. 3) Since the spot diameter of the light emitted from the emission portion can be reduced, it is no longer necessary to provide an optical system such as a lens which has conventionally been required for an LED array to focus a spot. As a result, the size of the entire system using a data back unit for a camera can be considerably reduced. 4) Since the etching process is performed between the adjacent elements before the cladding layer is etched, the current injected into one element does not unintentionally flow into another element, so that it is possible to independently emit the light beams from the respective elements. In addition to the above four effects, according to the LED array of this example, the following effects can be further obtained.

1) By providing the current blocking layer 12, an inefficient emission under the p-type electrode 8 can be suppressed. 2) Since it is not necessary to form an electrode for injecting a current on the emission plane (because the current flows as indicated by the arrow A shown in FIG. 9B), the emission is not shielded by the electrode 8 at all, so that the light can be output from the window 13 more effectively.

According to the fabrication method of this example, it is possible to eliminate the waste of the emission, so that it is possible to obtain a sufficient amount of output for printing a date on a negative film by using a current about one twentieth (in the first example, one tenth as described above) of the current required for a conventional LED array using an indirect transition type GaAs$_{0.15}$P$_{0.85}$ for a data back unit for a camera.

Furthermore, since the current blocking layer 12 is made of a material having light-absorptiveness with respect to a predetermined wavelength of the emitted light, the light obliquely emitted from the emission portion is absorbed into the current blocking layer 12. As a result, it is possible to separate the light beams emitted from adjacent elements (or to independently emit the light beams from the respective elements) with a higher precision.

EXAMPLE 3

Figure 13:
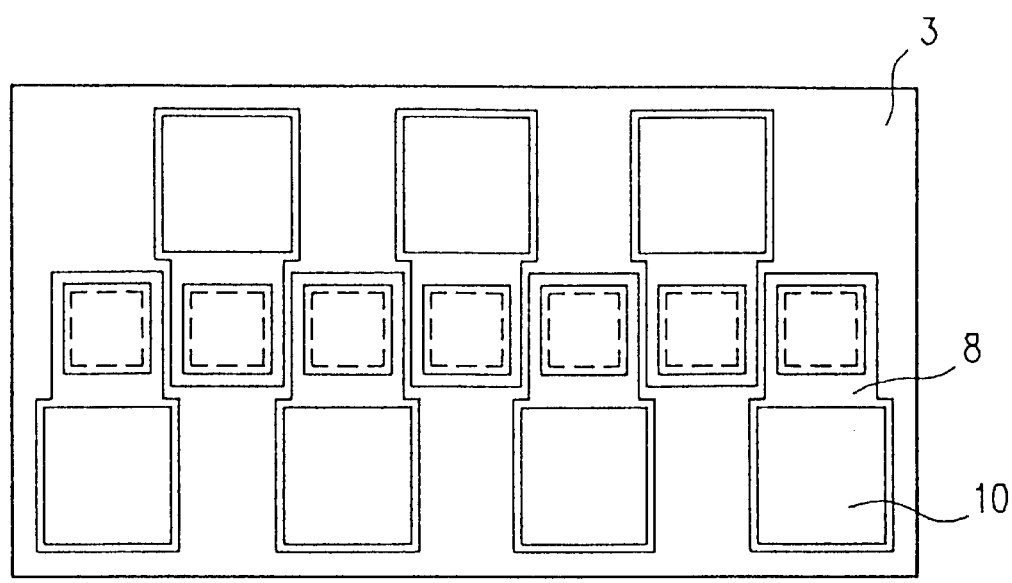
FIG. 13 is a top plan view of an LED array according to a third example of the present invention.
Figure 14A:
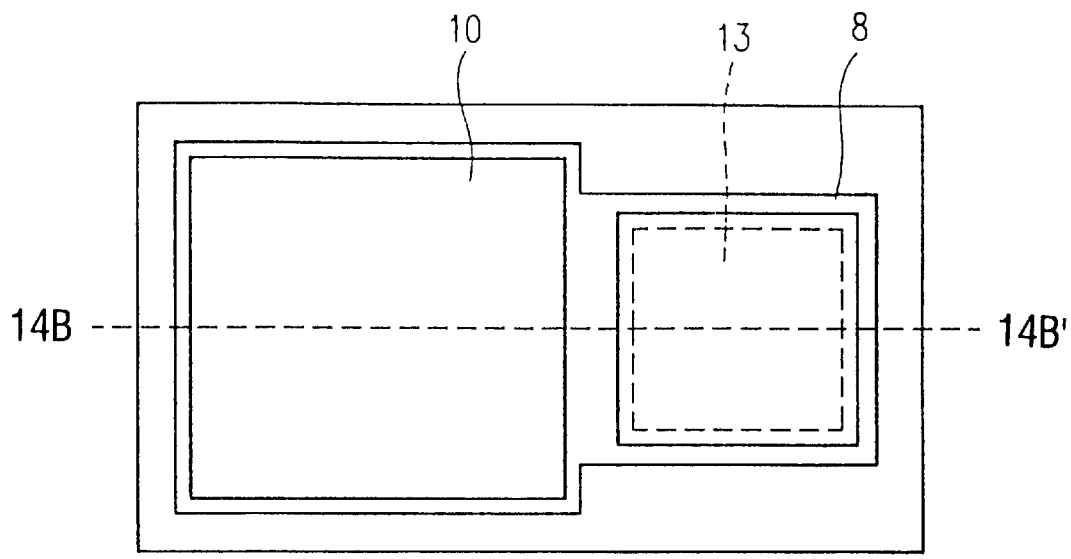
Figure 14B:
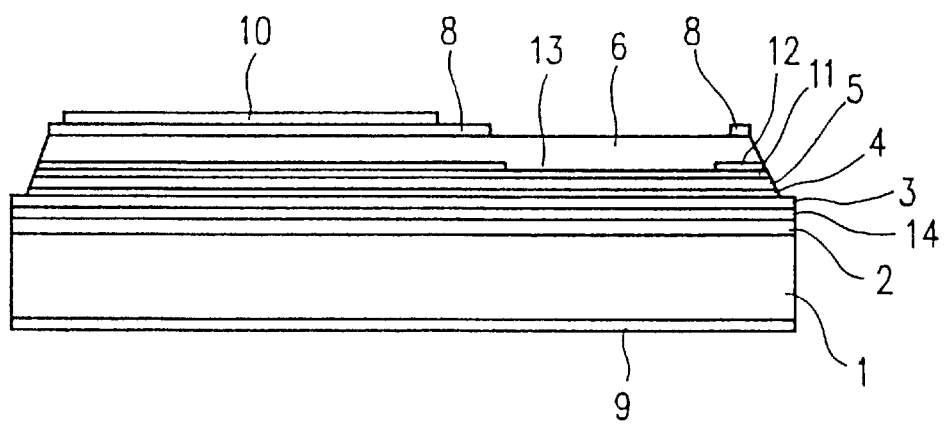
FIG. 14B is a cross-sectional view taken along the line 14B–14B' of the single LED shown in FIG. 14A.
Figure 15A:
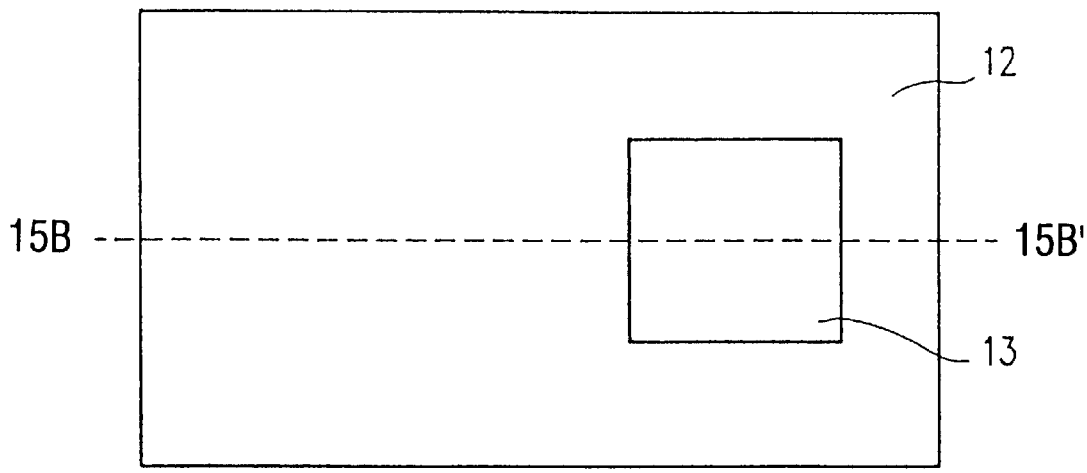
Figure 16A:
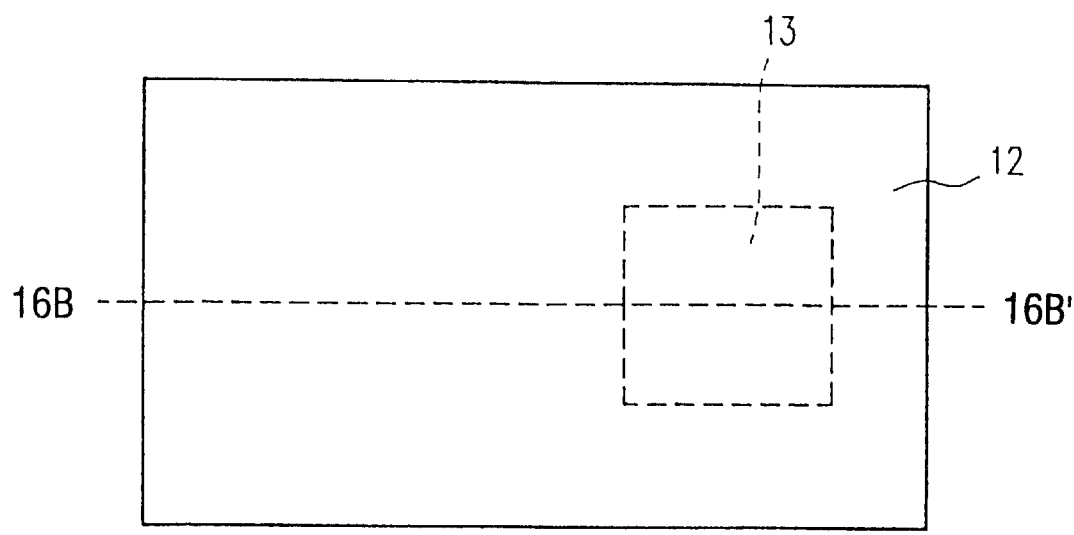
Figure 16B:
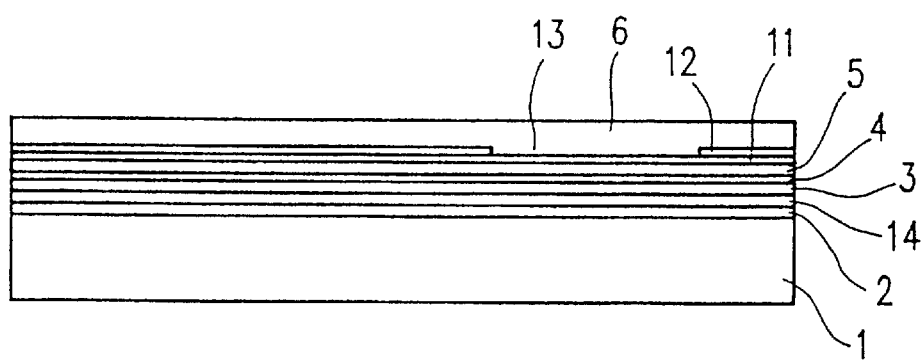
FIG. 16B is a cross-sectional view taken along the line 16B–16B' of the single LED shown in FIG. 16A.
Figure 17A:
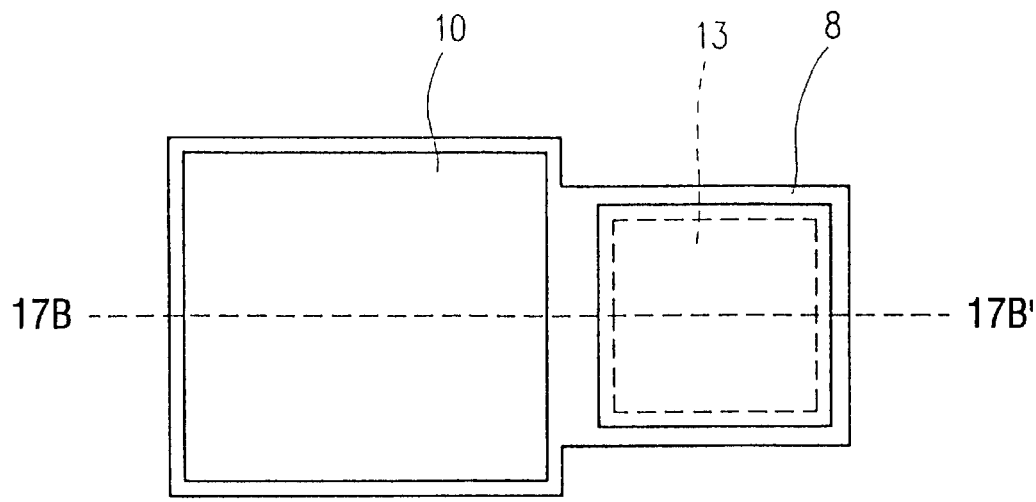
Figure 17B:
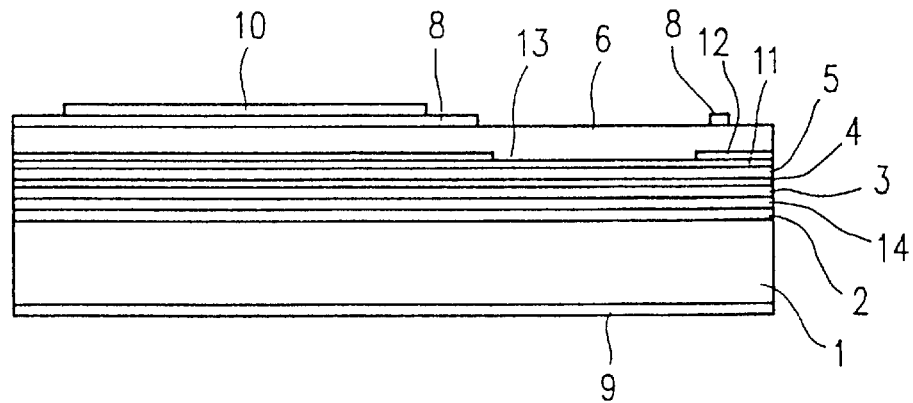
FIG. 17B is a cross-sectional view taken along the line 17B–17B' of the single LED shown in FIG. 17A.

FIG. 13 is a top plan view of an LED array according to a third example of the present invention. FIG. 14A is a top plan view of a single LED used for the LED array shown in FIG. 13, while FIG. 14B is a cross-sectional view taken along the line X-Y of the single LED shown in FIG. 14A. FIGS. 15A, 16A and 17A are top plan views of the single LED shown in FIGS. 14A and 14B at respective fabrication process steps, while FIGS. 15B, 16B and 17B are cross-sectional views taken along the line 15B–15B', 16B–16B' and 17B–17B' of the single LED shown in FIGS. 15A, 16A and 17A, respectively.

As shown in FIG. 14B, the LED according to the third example of the invention includes: an n-type GaAs substrate 1; an n-type (n=5×10$^{17}$ cm$^{-3}$) GaAs buffer layer 2 formed on the n-type GaAs substrate 1; a multi-layered reflection film 14 obtained by alternately depositing 20 pairs each of n-type (n=5×10$^{17}$ cm$^{-3}$) Al$_{0.5}$In$_{0.5}$P layers and n-type (n=5×10$^{17}$ cm$^{-3}$)(Al$_{0.4}$Ga$_{0.6}$)$_{0.5}$In$_{0.5}$P layers; an n-type (n=5×10$^{17}$ cm$^{-3}$) Al$_{0.5}$In$_{0.5}$P cladding layer 3; a p-type (p=3×10$^{17}$ cm$^{-3}$) Al$_{0.5}$In$_{0.5}$P cladding layer 5; an undoped (Al$_{0.3}$Ga$_{0.7}$)$_{0.5}$In$_{0.5}$P active layer 4 interposed between the n-type (n=5×10$^{17}$ cm$^{-3}$) Al$_{0.5}$In$_{0.5}$P cladding layer 3 and the p-type (p=3×10$^{17}$ cm$^{-3}$) Al$_{0.5}$In$_{0.5}$P cladding layer 5; a p-type (p=3×10$^{17}$ cm$^{-3}$) Ga$_{0.5}$In$_{0.5}$P cap layer 11; an n-type (n=2×10$^{18}$ cm$^{-3}$) (Al$_{0.2}$Ga$_{0.8}$)$_{0.5}$In$_{0.5}$P current blocking layer 12; a window 13 for outputting the light; an Al$_{0.7}$Ga$_{0.3}$As current diffusion layer 6; a p-type electrode 8; an n-type electrode 9; and a bonding pad 10. In this example, the multi-layered reflection film 14 is provided between the buffer layer 2 and the cladding layer 3, and the p-type electrode 8 is formed so as to surround the window 13 for outputting the light.

Figure 15B:
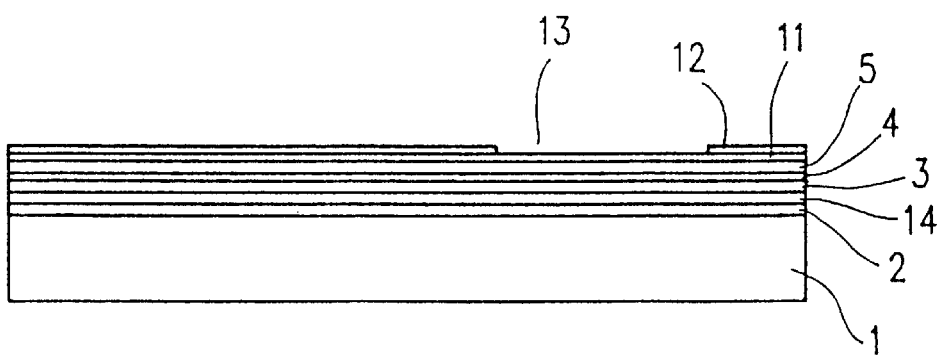
FIG. 15B is a cross-sectional view taken along the line 15B–15B' of the single LED shown in FIG. 15A.

First, as shown in FIGS. 15A and 15B, the n-type (n=5×10$^{17}$ cm$^{-3}$) GaAs buffer layer 2, the multi-layered reflection film 14 obtained by alternately depositing 20 pairs of n-type (n=5×10$^{17}$ cm$^{-3}$) Al$_{0.5}$In$_{0.5}$P layers and n-type (n=5×10$^{17}$ cm$^{-3}$)(Al$_{0.4}$Ga$_{0.6}$)$_{0.5}$In$_{0.5}$P layers, the n-type (n=5×10$^{17}$ cm$^{-3}$) Al$_{0.5}$In$_{0.5}$P cladding layer 3, the undoped (Al$_{0.3}$Ga$_{0.7}$)$_{0.5}$In$_{0.5}$P active layer 4, the p-type (p=3×10$^{17}$ cm$^{-3}$) Al$_{0.5}$In$_{0.5}$P cladding layer 5, the p-type (p=3×10$^{17}$ cm$^{-3}$) Ga$_{0.5}$In$_{0.5}$P cap layer 11 and the n-type (n=2×10$^{18}$ cm$^{-3}$) (Al$_{0.2}$Ga$_{0.8}$)$_{0.5}$In$_{0.5}$P current blocking layer 12 are deposited in this order on the n-type GaAs substrate 1, thereby forming the LED shown in FIGS. 13, 14A and 14B. The current blocking layer 12 is made of a light absorptive material. All these layers are formed by a metalorganic chemical vapor deposition (MOCVD) method. The thicknesses of the buffer layer 2, the cladding layer 3, the active layer 4, the cladding layer 5, the cap layer 11 and the current blocking layer 12 respectively are 0.5 $\mu$m, 1 $\mu$m, 0.6 $\mu$m, 1 $\mu$m, 50 Å and 0.2 $\mu$m.

Next, the n-type (Al$_{0.2}$Ga$_{0.8}$)$_{0.5}$In$_{0.5}$P current blocking layer 12 is etched by using heated phosphoric acid, thereby forming the window 13 for outputting the light. Then, as shown in FIGS. 16A and 16B, an Al$_{0.7}$Ga$_{0.3}$As current diffusion layer 6 is deposited by an MOCVD method on the n-type (Al$_{0.2}$Ga$_{0.8}$)$_{0.5}$In$_{0.5}$P current blocking layer 12 and the window 13 for outputting the light so as to be 3 $\mu$m thick.

Then, as shown in FIGS. 17A and 17B, Ti/AuZn is sputtered from the p-side. Thereafter, by performing a photolithographic process, an etching process using iodine based etchant and dilute hydrofluoric acid and a heat treatment, the p-type electrode 8 is formed so as to surround the window 13 for outputting the light. Subsequently, AuGe/Ni is deposited from the n-side and subjected to a heat treatment, thereby forming the n-type electrode 9. Thereafter, by sputtering Ti/Au from the p-side and performing a photolithographic process and a chemical etching process using iodine based etchant and dilute hydrofluoric acid, the bonding pad 10 is formed.

Next, a photolithographic process is performed for electrically isolating the respective elements, the Al$_{0.7}$Ga$_{0.3}$As current diffusion layer 6 is etched by using a sulfuric acid and hydrogen peroxide based etchant, the n-type (Al$_{0.2}$Ga$_{0.8}$)$_{0.5}$In$_{0.5}$P current blocking layer 12 is etched by using heated sulfuric acid, the p-type Ga$_{0.5}$In$_{0.5}$P cap layer 11 is etched by using bromine based etchant, and the mesa etching is performed before the n-type Al$_{0.5}$In$_{0.5}$P cladding layer 3 is etched. Thereafter, the (Al$_{0.2}$Ga$_{0.8}$)$_{0.5}$In$_{0.5}$P current blocking layer 12 and the p-type Ga$_{0.5}$In$_{0.5}$P cap layer 11 in the convex portion on the side of the mesa are etched by using bromine based etchant. Finally, the Al$_{0.7}$Ga$_{0.3}$As current diffusion layer 6 in the convex portion on the side of the mesa is etched again by using a sulfuric acid and hydrogen peroxide based etchant, thereby forming the LED shown in FIGS. 14A and 14B.

According to the LED array of the third example of the invention thus formed makes possible the following advantages in addition to the advantages obtained by the methods of the first and the second examples.

More specifically, since the multi-layered reflection film 14 is provided, the light proceeding to the substrate is reflected and can be output more effectively through the window 13. As a result, in the LED array of the third example, it is possible to obtain a sufficient amount of output for printing a date on a negative film by using a current about one thirtieth (in the first example, one tenth and in the second example, one twentieth as described above) of the current required for a conventional LED array using an indirect transition type GaAs$_{0.15}$P$_{0.85}$ layer for a data back unit for a camera. In FIG. 14B, the multi-layered reflection film 14 is provided between the buffer layer 2 and the cladding layer 3. Alternatively, the multi-layered reflection film 14 can be provided anywhere between the n-type GaAs substrate 1 and the active layer 4. Irrespective of the position where the multi-layered reflection film 14 is provided, the same effects can be attained.

In addition, since the p-type electrode 8 is formed so as to surround the window 13 for outputting the light, it is possible to obtain more uniform emission as compared with the second example, because the current can be injected uniformly all through the window 13 for outputting the light.

Furthermore, since the mesa etching is performed at three stages: namely, the current diffusion layer 6 is etched by using a sulfuric acid and hydrogen peroxide based etchant during the first stage, the cladding layer 5 and the active layer 4 are etched by using heated sulfuric acid during the second stage, and the current diffusion layer 6 is etched again by using a sulfuric acid and hydrogen peroxide based etchant during the third stage, it is possible to eliminate the convex portion on the side of each element.

The mesa is etched in the following manner by performing the respective etching process steps. The current diffusion layer 6 is etched in a trapezoidal shape during the first-stage etching process, and cladding layer 5 and the active layer 4 are etched in a similar trapezoidal shape during the second-stage etching process. However, the cladding layer 5 and the active layer 4 are over-etched to a certain degree in the upper portion of the trapezoid of the cladding layer 5 and the active layer 4 or the lower portion of the current diffusion layer 6, so that the lower end portion of the current diffusion layer 6 comes to project. By etching again the current diffusion layer 6 using heated sulfuric acid during the third-stage etching process, it is possible to eliminate the convex portion in a projective shape and obtain a mesa in a uniform shape without any convex portion.

In a conventional mesa etching, the mesa is etched at two stages: the mesa is first etched by using a sulfuric acid and hydrogen peroxide based etchant, and then etched by using heated sulfuric acid. However, according to such a conventional method, the resulting shape of the mesa becomes a reversed trapezoidal shape, the upper portion of which is larger than the lower portion. If the mesa is in such a shape, then stress is likely to be applied to the mesa, especially when the mesa is molded by using a resin material at a low temperature. As a result, the LED is likely to be deformed or broken owing to the distortion caused by the stress, and the reliability of the LED is disadvantageously degraded.

However, according to the method of this example, a mesa in a uniform shape can be obtained as described above. Therefore, a highly reliable LED array is realized. Based on the results of the experiment for testing the reliability of an LED array by supplying a current at a low temperature (−25° C., for example), the degradation rate of the LED after 5000 hours of use is proven to be reduced to one half as compared with that in the second example.

EXAMPLE 4

Figure 18:
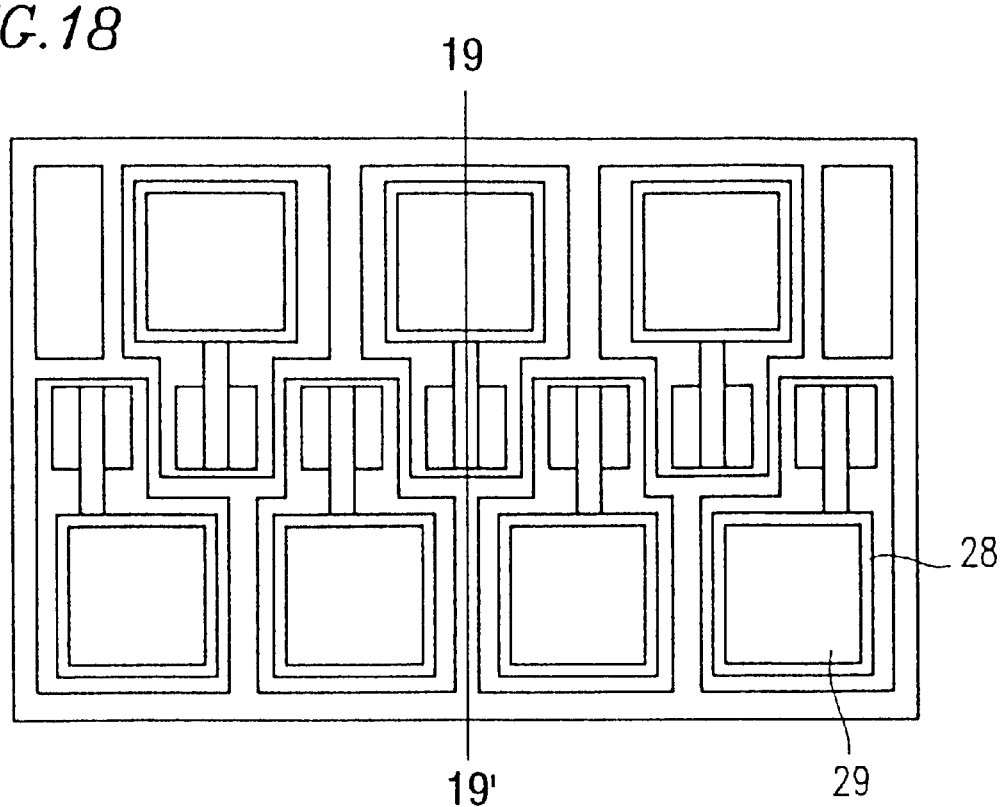
FIG. 18 is a top plan view of an LED array according to a fourth example of the present invention.

FIG. 18 is a top plan view of an LED array according to a fourth example of the present invention. FIGS. 19A to 19E are cross-sectional views, taken along the line 19A–19A' in FIG. 18, showing the respective process steps for fabricating a single LED used for the LED array shown in FIG. 18. The fourth example is totally different from the first to third examples in that a current blocking layer is formed in the upper portion of the element.

In such a structure, the emitted light is confined on the surface of an element. As a result, as compared with the case of providing a current blocking layer in the center portion of the element, the light beams can be separated more efficiently when the element is seen from above, or it is possible to control the emission region with a higher precision and separate the light beams more sharply. The fabrication process steps of such an LED array will be described in detail with reference to the drawings.

Figure 19A:
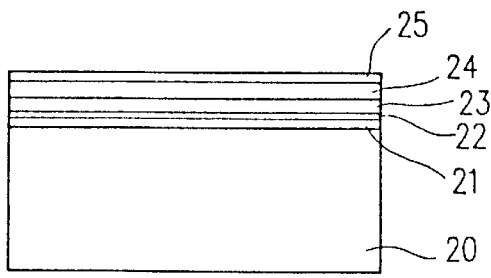
FIGS. 19A to 19E are cross-sectional views showing the respective process steps for fabricating a single LED used for the LED array shown in FIG. 18.

First, as shown in FIG. 19A, an n-type $Al_{0.5}In_{0.5}P$ cladding layer 21 (thickness: 1 $\mu$m), an undoped $(Al_{0.3}Ga_{0.7})_{0.5}In_{0.5}P$ active layer 22 (thickness: 0.6 $\mu$m), and a p-type $Al_{0.5}In_{0.5}P$ cladding layer 23 (thickness: 1 $\mu$m) are deposited in this order on a GaAs substrate 20 by an MOCVD method, thereby forming an LED array including a PN junction of this example.

Next, a p-type AlGaAs layer 24 is formed as a current diffusion layer also be an MOCVD method so as to be 3 $\mu$m thick, and an n-type GaAs layer 25 required for shielding the light and blocking the current is formed. The thickness of the n-type GaAs layer 25 is required to be 0.5 $\mu$m or more and the carrier density is required to be about $5 \times 10^{18}/cm^3$ or more so that the light can be satisfactorily shielded and that the current can be blocked by maintaining an N-type polarity even after an alloy reaction with a p-type electrode 28. On the other hand, in order to prevent the disconnection of the electrode lines overlapping the emission portion, the thickness of the n-type GaAs layer 25 is preferably 1 $\mu$m or less. Therefore, in this example, the thickness of the n-type GaAs layer 25 is set to be 0.8 $\mu$m. In this way, an epi-wafer can be obtained.

Figure 19B:
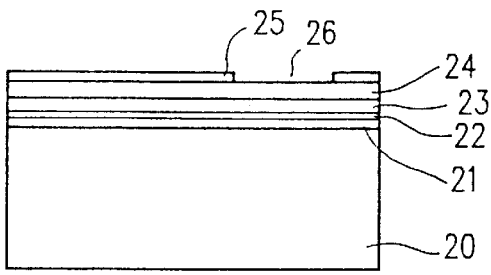

Subsequently, as shown in FIG. 19B, a portion of the GaAs layer 25 to be used for the light emission is removed by common photolithographic and etching processes using the epi-wafer shown in FIG. 19A, thereby forming a window 26. By performing the above process steps, it is possible to form an LED array having a PN structure in the window 26 to be used for the light emission and an NPN structure in the remaining portions. The n-type GaAs layer 25 functioning as a current blocking layer is formed on the p-type $Al_{0.7}Ga_{0.3}As$ layer 24 functioning also as a current diffusion layer.

Figure 19C:
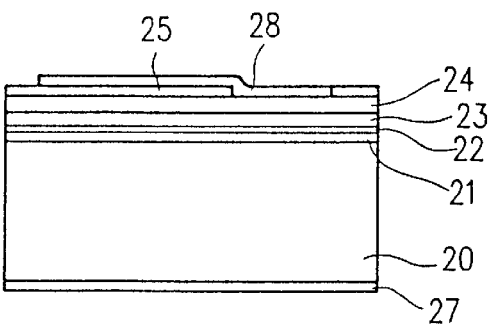

Thereafter, as shown in FIG. 19C, a metallic material allowing for forming an ohmic contact with the p-type AlGaAs layer 24, e.g., Ti/AuZn, is sputtered. Then AuGe is deposited or sputtered on the reverse side of the n-type GaAs substrate 20, thereby forming a reverse side electrode 27. Then, a p-type electrode pattern is formed by performing common photolithographic and etching processes, and is subjected to a heat treatment so as to form a satisfactory ohmic electrode 28. In the case where the carrier density of the p-type $Al_{0.7}Ga_{0.3}As$ layer 24 is on the order of $5 \times 10^8/cm^3$, a metallic material including a p-type dopant such as AuZn is required. On the other hand, a bonding pad 29 is required in order to obtain a satisfactory bonding properties. The bonding pad 29 is formed in the following manner.

Figure 19D:
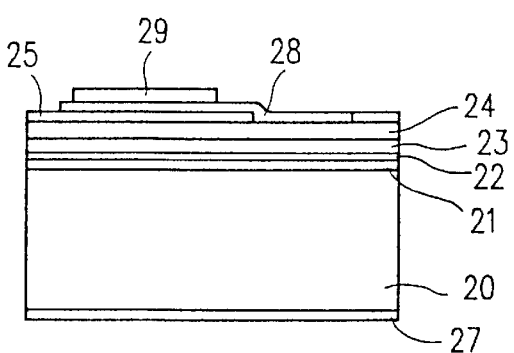

First, as shown in FIG. 19D, in view of the adhesiveness with the line metal such as AuZn, a barrier metal such as Ti or TiW and pure Al or Au is continuously formed by sputtering. In this example, the barrier metal can be a metal other than a Ti-based metallic material, such as Mo or W. Subsequently, by performing common photolithography and etching processes, the bonding pad 29 is formed. It is noted that an etchant which etches almost no portion of the n-type GaAs layer 25 is required to be selected in etching a barrier metal.

In the case where the carrier density of the p-type AlGaAs layer 24 is $5.0 \times 10^{19}/cm^3$ or more, an ohmic contact can be obtained by using Al only. Therefore, if the electrode lines are provided by forming Al so as to be 2.5 $\mu$m thick or more by sputtering, then it is no longer necessary to form the bonding pad 29.

Figure 19E:
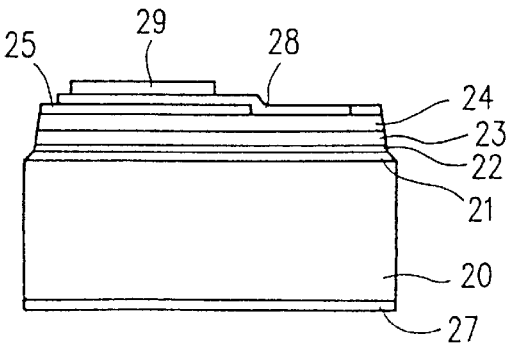

Next, as shown in FIG. 19E, in order to electrically isolate adjacent light-emitting elements surely and efficiently inject a current into the PN junction, a mesa etching is performed. Finally, by dicing the assembly into respective arrays, an LED array having a monolithic structure can be obtained.

By forming the LED array having such a structure, the luminous efficiency can be improved and the size of the LED array can be reduced, in the same way as in the first to third examples. In addition, since the LED array has an NPN structure except for the emission portion, the flowing current is concentrated in the emission portion. Accordingly, it is no longer necessary to provide an insulating layer in the portions other than the emission portion, thereby simplifying the fabrication process.

In addition, since a current blocking layer is formed in the uppermost portion, except for the electrode, of the LED, the light beams can be separated more surely and precisely as compared with the structures of the first to third examples. However, a part of the window 26 is covered with the electrode 28, so that the light is shielded by the electrode 28. That is to say, since an electrode is formed on the surface of the window 26, the light can be output more effectively in the second and the third examples than in the fourth example.

As is apparent from the foregoing description, the LED array having a monolithic structure according to the present invention can operate at an extremely lower power consumption as compared with a conventional LED array for a data back unit for a camera.

In addition, although a conventional LED array shown in FIG. 20 is obtained by arranging single light-emitting chips in parallel on a substrate or the like, the present invention realizes an LED array having a monolithic structure. As a result, the size of the LED array can be considerably reduced.

Moreover, since the spot diameter of the light emitted from the emission portion can also be reduced, it is no longer necessary to provide an optical system such as a lens which has conventionally been required for focusing a spot and the size of the entire system using this data back unit can also be reduced.

Also, thanks to the electrical isolation effects obtained by the etching performed between adjacent elements, it is possible to independently emit the light beams from the respective elements and separate the light beams with a high precision.

Furthermore, since the mesa etching is performed for each element at three stages, it is possible to form a mesa in a uniform shape without any convex portion on the side thereof. Accordingly, stress is not likely to be applied to the LED array even at a low temperature, so that it is possible to eliminate the deformation or the breakdown of the LED array owing to the distortion caused by the stress. As a result, a highly reliable LED array can be obtained.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A light-emitting diode array comprising:
   a semiconductor substrate of a first conductivity type, and a plurality of light-emitting elements linearly arranged on the substrate of the first conductivity type,
   each of the plurality of light-emitting elements having integrally formed light-emitting and pad electrode sections and comprising:
   a lower cladding layer of the first conductivity type; an upper cladding layer of a second conductivity type; an $(Al_xGa_{1-x})_yIn_{1-y}P$ (where $0 \leq x \leq 1$ and $0 \leq y \leq 1$) active layer interposed between the lower cladding layer and the upper cladding layer the upper cladding layer being contained, from a plan view, within the active layer; a current diffusion layer of the second conductivity type deposited on the upper cladding layer; an insulating layer formed on the current diffusion layer in the pad electrode section, but not in the light-emitting section; an electrode of the second conductivity type having a first portion formed on the insulating layer in the pad electrode section and a second portion formed on the current diffusion layer in the light-emitting section; and a bonding pad formed on the first portion of the electrode of the second conductivity type,
   wherein an isolation groove that surrounds both the light-emitting section and the pad electrode section of each of two adjacent light-emitting elements among the plurality of light-emitting elements is provided in order to isolate these two adjacent light-emitting elements into respective, isolated island-like mesa regions, the isolation groove penetrating at least the current diffusion layer and the upper cladding layer, but not reaching the upper surface of the lower cladding layer, and
   wherein a surface of each island-like region defined by the electrode of the corresponding light-emitting element is flat, except for a stepped portion between the first and second portions of the electrode due to the thickness of the insulating layer.

2. A light-emitting diode array according to claim 1, wherein the isolation groove is provided by performing an etching between the two adjacent light-emitting elements among the plurality of light-emitting elements.

3. A light-emitting diode array according to claim 1, wherein the insulating layer is a $SiN_x$ layer.

4. A light-emitting diode array according to claim 2, each of the plurality of light-emitting elements further comprising: a current blocking layer of the first conductivity type disposed on a side of the current diffusion layer with respect to the active layer; and a window for outputting emitted light formed by partially etching the current blocking layer of the first conductivity type.

5. A light-emitting diode array according to claim 4, wherein a band gap of the current blocking layer of the first conductivity type is smaller than a band gap of the active layer.

6. A light-emitting diode array according to claim 5, wherein the current blocking layer of the first conductivity type is an $(Al_xGa_{1-x})_yIn_{1-y}P$ (where $0 \leq x \leq 1$ and $0 \leq y \leq 1$) layer.

7. A light-emitting diode array according to claim 4, wherein the current blocking layer of the first conductivity type is formed as an uppermost layer of the light-emitting diode array except for electrode portions.

8. A light-emitting diode array according to claim 5, wherein the current blocking layer of the first conductivity type is a GaAs layer.

9. A light-emitting diode array according to claim 1 wherein a multi-layered reflection film of the first conductivity type is formed between the substrate and the active layer.

10. A light-emitting diode array according to claim 9, wherein the multi-layered reflection film of the first conductivity type is a reflection film obtained by alternately depositing 20 pairs each of $Al_{0.5}In_{0.5}P$ layers and $(Al_{x1}Ga_{1-x1})_{0.5}In_{0.5}P$ layers, where x is a mixed crystal ratio of Al in the active layer and $x_1 > x$.

11. A light-emitting diode array according to claim 1, wherein the current diffusion layer has a first etched groove, and the cladding layer of the second conductivity type has a second etched groove, the second etched groove being provided at a position corresponding to a position of the first etched groove so as to constitute the isolation groove, and the first and second etched grooves being formed in separate etching processes from each other.

12. A light-emitting diode array according to claim 11, wherein the first and second etched grooves form a single groove which is positioned between the two adjacent light-emitting elements so as to electrically isolate the two adjacent light-emitting elements.

13. A light-emitting diode array according to claim 12, wherein the single groove has a uniform side face without any convex portion in a projecting shape formed thereon.

14. A light emitting diode array according to claim 1, wherein the light emitting sections of the light emitting elements are linearly arranged and the bonding pad sections of the light emitting elements are arranged in first and second rows located on opposite sides of the linearly arranged light emitting sections such that the bonding pad sections associated with adjacent light emitting sections are disposed in opposite ones of said first and second rows, and a distance between the centers of adjacent bonding pad sections in each of said first and second rows is smaller than a distance between the centers of the light emitting sections to which these adjacent bonding pads are connected.

15. A light emitting diode array according to claim 1, wherein a connection portion between each light emitting section and its corresponding bonding pad section is offset relative to the center of the bonding pad section.

16. A light-emitting diode array comprising:
   a semiconductor substrate of a first conductivity type, and a plurality of light-emitting elements linearly arranged on the substrate,
   each of the plurality of light-emitting elements having integrally formed light-emitting and pad electrode sections and comprising:
   a lower cladding layer of the first conductivity type; an active layer formed on the lower cladding layer; an upper cladding layer of a second conductivity type formed on the active layer, said active layer extending under the entire upper cladding layer; a current diffusion layer of the second conductivity type deposited on the upper cladding layer;

an insulating layer formed on the current diffusion layer in the pad electrode section, but not in the light-emitting section;

an electrode of the second conductivity type having a first portion formed on the insulating layer in the pad electrode section and a second portion formed on the current diffusion layer in the light-emitting section; and a bonding pad formed on the first portion of the electrode of the second conductivity type, wherein an isolation groove that surrounds both the light-emitting section and the pad electrode section of each of two adjacent light-emitting elements among the plurality of light-emitting elements is provided in order to isolate these two adjacent light-emitting elements into respective, island-like mesa regions, the isolation groove penetrating at least the current diffusion layer and the upper cladding layer, but not reaching the upper surface of the lower cladding layer, wherein a surface of each island-like region formed by the electrode of the corresponding light-emitting element is flat, except for a stepped portion between the first and second portions of said electrode due to the thickness of the insulating layer.

17. A light-emitting diode array according to claim 16, wherein the active layer comprises $(Al_xGa_{1-x})_yIn_{1-y}P$ (where $0 \leq x \leq 1$ and $0 \leq y \leq 1$).

18. The light emitting diode array according to claim 1, wherein the pad electrode section and the light emitting section of the light emitting diode elements comprise respective mesa-shaped portions connected by a connection portion.

19. A light emitting diode array according to claim 16, wherein the light emitting sections of the light emitting elements are linearly arranged and the bonding pad sections of the light emitting elements are arranged in first and second rows located on opposite sides of the linearly arranged light emitting sections such that the bonding pad sections associated with adjacent light emitting sections are disposed in opposite ones of the first and second rows, and a distance between the centers of adjacent bonding pad sections in each of said first and second rows is smaller than a distance between the centers of the light emitting sections to which these adjacent bonding pads are connected.

20. A light emitting diode array according to claim 16, wherein a connection portion between each light emitting section and its corresponding bonding pad section is offset relative to the center of the bonding pad section.

21. A light emitting diode array according to claim 16, wherein each light emitting diode element further comprises:

a multi-layered reflection film formed between the substrate and the active layer.

22. A light emitting diode array according to claim 16, wherein each light emitting diode element further comprises:

a current blocking layer formed above the active layer and provided with an opening therein in the light emitting region.

23. The light emitting diode array according to claim 16, wherein the pad electrode section and the light emitting section of the light emitting diode elements comprise respective mesa-shaped portions connected by a connection portion.

* * * * *